(12) United States Patent
Kim et al.

(10) Patent No.: US 10,941,341 B2
(45) Date of Patent: *Mar. 9, 2021

(54) ETCHING COMPOSITION ADDITIVE, METHOD FOR PREPARING THE SAME AND ETCHING COMPOSITION COMPRISING THE SAME

(71) Applicants: SK Innovation Co., Ltd., Seoul (KR); SK-Materials Co., Ltd., Yeongju-si (KR)

(72) Inventors: Cheol Woo Kim, Daejeon (KR); Yu Na Shim, Daejeon (KR); Je Ho Lee, Daejeon (KR); Jae Hoon Kwak, Yeongju-si (KR); Young Bom Kim, Yeongju-si (KR); Jin Kyung Jo, Yeongju-si (KR)

(73) Assignees: SK Innovation Co., Ltd., Seoul (KR); SK-Materials Co., Ltd., Yeongju-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/594,387

(22) Filed: Oct. 7, 2019

(65) Prior Publication Data

US 2020/0131438 A1    Apr. 30, 2020

(30) Foreign Application Priority Data

Oct. 25, 2018  (KR) .......................... 10-2018-0128248

(51) Int. Cl.
*C09K 13/04*     (2006.01)
*C09K 13/06*     (2006.01)
(Continued)

(52) U.S. Cl.
CPC .............. *C09K 13/04* (2013.01); *C09K 13/06* (2013.01); *C09K 13/00* (2013.01); *C23F 1/16* (2013.01);
(Continued)

(58) Field of Classification Search
CPC ......... G11B 7/244; G11B 7/247; G11B 7/248; Y10S 428/913; Y10S 428/92;
(Continued)

(56) References Cited

U.S. PATENT DOCUMENTS

| | | | |
|---|---|---|---|
| 9,368,647 B2 * | 6/2016 | Hong | C09K 13/04 |
| 9,868,902 B2 * | 1/2018 | Lee | H01L 21/0214 |
| 2015/0348799 A1 * | 12/2015 | Hong | H01L 29/66825 |
| | | | 438/268 |

* cited by examiner

*Primary Examiner* — Lan Vinh
(74) *Attorney, Agent, or Firm* — Oblon, McClelland, Maier & Neustadt, L.L.P.

(57) ABSTRACT

An etching composition providing a high selection ratio enabling selective removal of a nitride film and minimization of an etching rate, a preparation method thereof, an etching composition additive prepared through a reaction of phosphoric anhydride and a silane compound represented by Formula 1 below, a method for preparing the same and an etching composition including the same are provided:

[Formula 1]

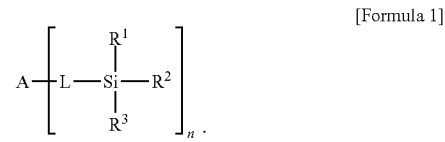

20 Claims, 1 Drawing Sheet

(51) Int. Cl.
 *H01L 21/321* (2006.01)
 *C23F 1/16* (2006.01)
 *H01L 21/311* (2006.01)
 *C09K 13/00* (2006.01)

(52) U.S. Cl.
 CPC ......... *H01L 21/311* (2013.01); *H01L 21/3212* (2013.01)

(58) Field of Classification Search
 CPC ......... Y10S 430/146; Y10T 428/24876; C09K 13/04; C09K 13/06; C23F 1/16; C23F 1/14; H01L 21/3212; H01L 21/311; H01L 21/3213
 USPC .... 252/79.1, 79.2, 79.3, 79.4; 438/692, 693, 438/694, 745, 75, 750, 691
 See application file for complete search history.

ETCHING COMPOSITION ADDITIVE, METHOD FOR PREPARING THE SAME AND ETCHING COMPOSITION COMPRISING THE SAME

CROSS-REFERENCE TO RELATED APPLICATION(S)

This application claims benefit of priority to Korean Patent Application No. 10-2018-0128248 filed on Oct. 25, 2018 in the Korean Intellectual Property Office, the disclosure of which is incorporated herein by reference in its entirety.

BACKGROUND

1. Field

The present disclosure relates to an etching composition additive, a method for preparing the same and an etching composition including the same. Specifically, the present disclosure relates to an etching composition additive providing a high selection ratio capable of selectively removing a nitride film while minimizing an etching rate and preventing gelation of an etchant, a method for preparing the same and an etching composition including the same.

2. Description of Related Art

An oxide film such as a silicon oxide ($SiO_2$) film and a nitride film such as a silicon nitride (SiNx) film are representative insulator films, and in a semiconductor manufacturing process, the silicon oxide film or the silicon nitride film is used alone or in the form of a laminate in which one or more films are alternately stacked. In addition, the oxide film or the nitride film is also used as a hard mask for forming a conductive pattern such as a metal wiring.

In a wet etching process for removing the nitride film, a mixture of phosphoric acid and deionized water is generally used. The deionized water is added for preventing a decrease in an etching rate and a change in etching selectivity of an oxide film; however, there may be a problem in that defects may arise in a nitride film etching removal process even with a minute change in an amount of supplied deionized water. In addition, phosphoric acid is a strong acid and is corrosive, thereby having difficulties in handling.

In order to solve these problems, there is a conventionally known technology for removing a nitride film using an etching composition including fluoric acid (HF), nitric acid ($HNO_3$), or the like in phosphoric acid ($H_3PO_4$), which may result in inhibiting an etching selection ratio of the nitride film and the oxide film. In addition, there is also a known technology of using an etching composition including phosphoric acid and a silicate or silicic acid; however, the silicic acid or silicate has a problem of causing particles which may affect a substrate, thereby being somewhat inappropriate for a semiconductor manufacturing process.

However, when phosphoric acid is used in a wet etching process for removing the nitride film, not only the nitride film but also an SOD oxide film is etched due to a reduced etching selection ratio between the nitride film and the oxide film, whereby it is difficult to adjust an effective field oxide height (EFH). Accordingly, a sufficient wet etching time for removing the nitride film may not be secured, or an additional process is required, which may cause a change and has a negative influence on device characteristics.

Therefore, an etching composition having a high selection ratio, which selectively etches a nitride film to an oxide film and does not have a problem such as particle occurrence in a semiconductor manufacturing process, and an additive for the etching composition are currently demanded.

SUMMARY

An aspect of the present disclosure may provide an etching composition having a high selection ratio, which may selectively remove a nitride film while minimizing an etching rate of an oxide film, and does not have problems such as particle occurrence having a bad influence on device characteristics, an additive used for the etching composition and a method for preparing the additive.

According to an aspect of the present disclosure, an etching composition may include phosphoric acid, and an etching composition additive, a reaction product of a silane compound represented by the following Formula 1:

[Formula 1]

$$A \!-\!\!\left[\!L\!-\!\!\underset{\underset{R^3}{|}}{\overset{\overset{R^1}{|}}{Si}}\!-\!R^2\right]_n$$

In Formula 1, A is an n-valent radical; L is a direct bond or $C_1$-$C_3$ hydrocarbylene; $R^1$ to $R^3$ are independently hydrogen, hydroxy, $C_1$-$C_{20}$ hydrocarbyl or $C_1$-$C_{20}$ alkoxy; and n is an integer of 2 to 5. The silane compound of Formula 1 excludes siloxane.

In Formula 1, the $R^1$ to $R^3$ may be independently $C_1$-$C_{20}$ alkoxy.

In Formula 1, the A may be $C_1$-$C_{20}$ hydrocarbylene, an amine salt radical, a radical having N as a binding site, a radical having O as a binding site, a radical having S as a binding site or a radical having P as a binding site.

The A may be *—$N^+(R^{11}R^{12})X_1^-$—*,

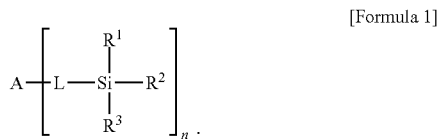

*—$NR^{13}$—*, —$NR^{14}L_1R^{15}$—*, *—$NR^{16}CONR^{17}$—*, *—$NR^{18}CSNR^{19}$—*, —$NR^{20}CONR^{21}L_2NR^{22}CONR^{23}$—*, *—$NR^{24}CONL_3L_4NCONR^{25}$—*,

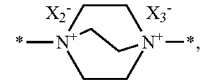

*—O—*, *—S—*, *—S—S—*,

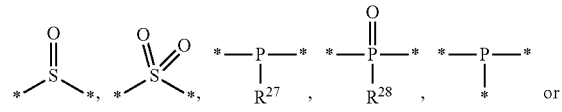

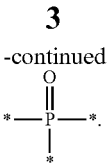

$X_1$ to $X_3$ are independently halogen or a $C_1$-$C_{20}$ alkyl carbonate group, and $R^{11}$ to $R^{26}$ are independently hydrogen, $C_1$-$C_{20}$ alkyl or $C_6$-$C_{20}$ aryl, while $R^{27}$ and $R^{28}$ are independently hydrogen, $C_1$-$C_{20}$ alkyl, $C_6$-$C_{20}$ aryl, $C_1$-$C_{20}$ alkoxy or $C_1$-$C_{20}$ alkyl$C_1$-$C_{20}$ alkoxy. $L_1$ to $L_4$ are $C_1$-$C_{20}$ alkylene, $C_6$-$C_{20}$ arylene or $R^{31}(OR^{32})_p$, where $R^{31}$ and $R^{32}$ are independently $C_1$-$C_{20}$ alkylene, and p is an integer of 1 to 5. $L_5$ is a direct bond or $(CH_2)_qNR^{33}NR^{34}$, where $R^{33}$ and $R^{34}$ are independently hydrogen, $C_1$-$C_{20}$ alkyl or $C_6$-$C_{20}$ aryl, and q is an integer of 1 to 5, but preferably 2 or 3.

The silane compound of Formula 1 may be at least one selected from following Structural Formulae 1 to 26:

(1)
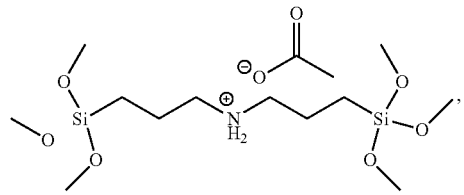

(2)
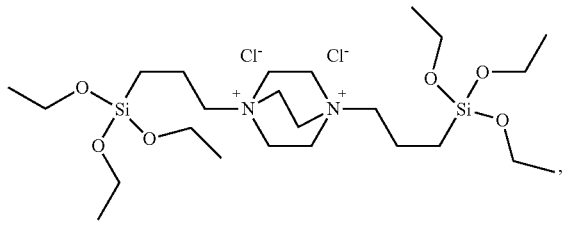

(3)
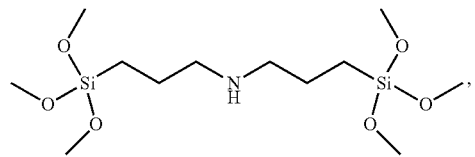

(4)
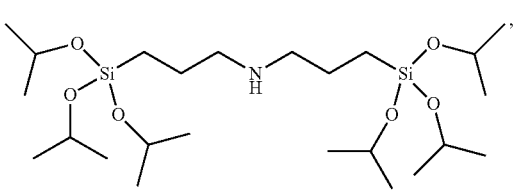

(5)
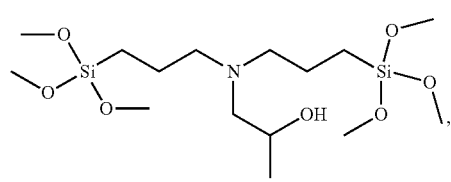

(6)
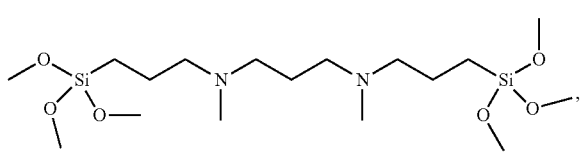

(7)
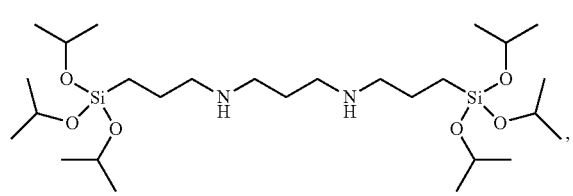

(8)
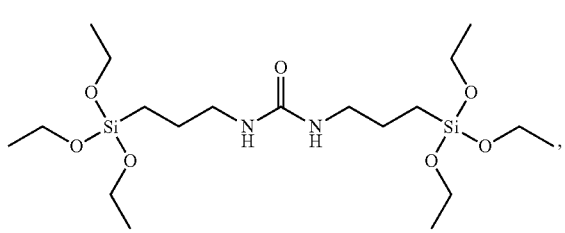

(9)
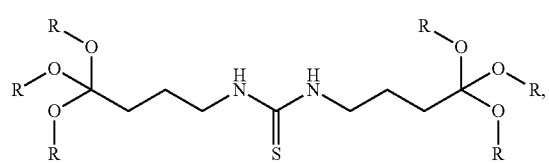

(10)
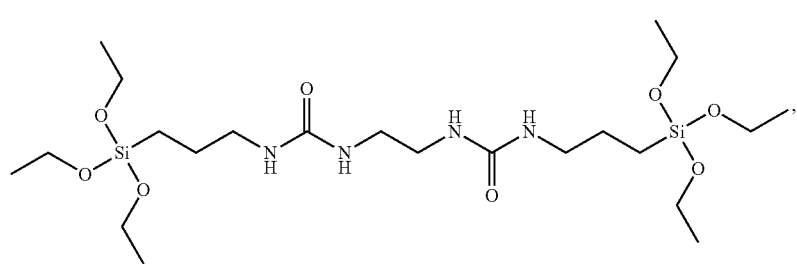

(11)
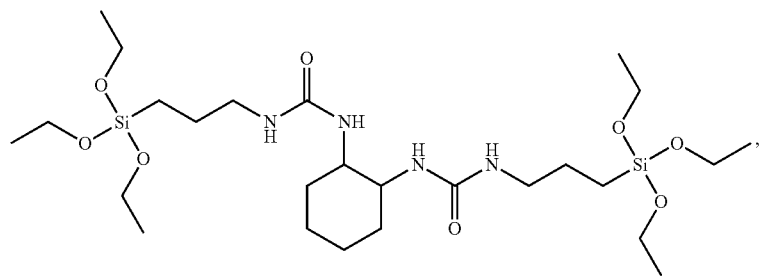
(12)
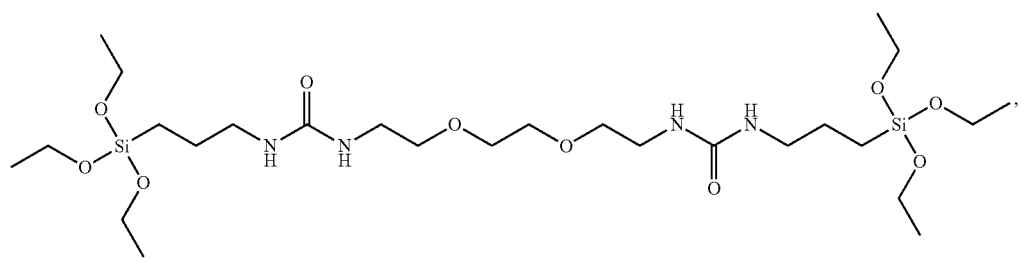
(13)
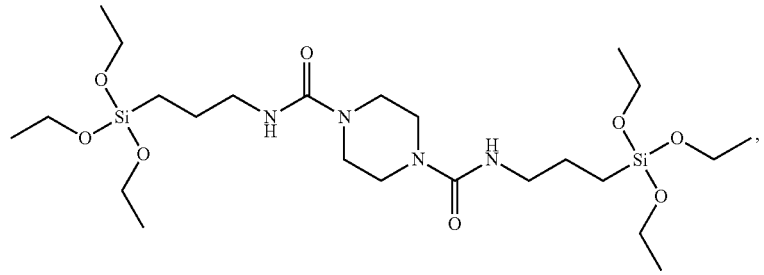
(14)
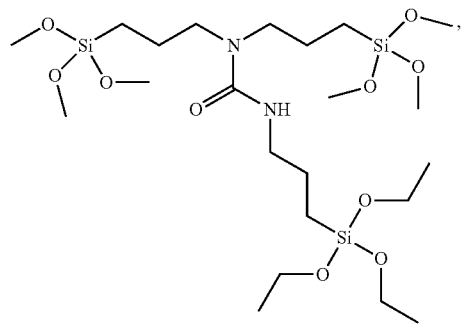
(15)
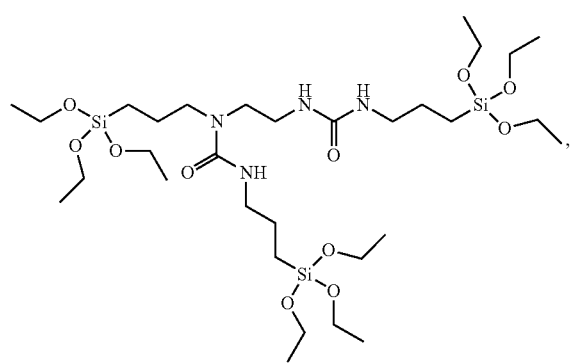
(16)
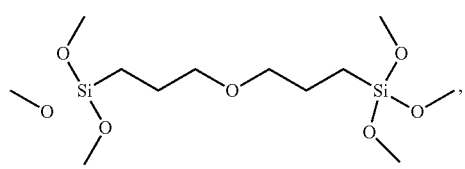

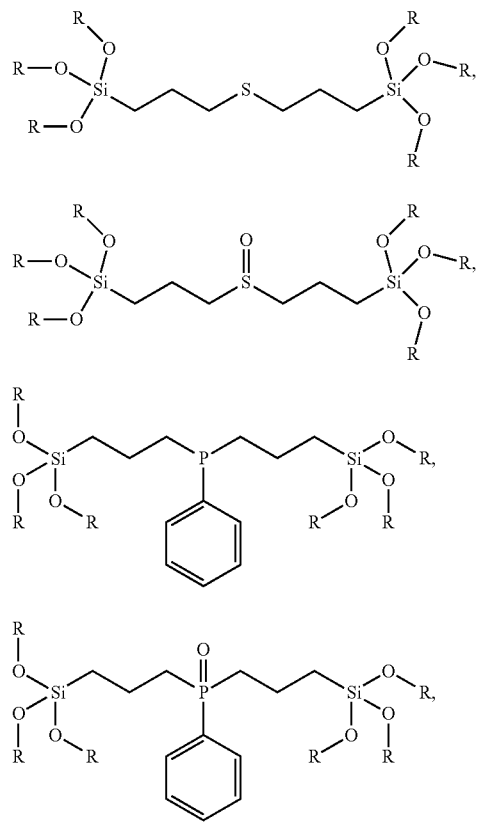

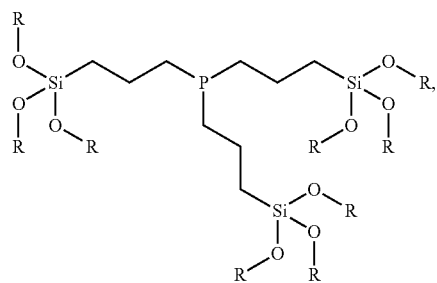

wherein, in the above formulae, R is hydrogen, $C_1$-$C_{20}$ alkyl or $C_6$-$C_{20}$ aryl.

The phosphoric anhydride may be at least one selected from the group consisting of water-removed pure phosphoric acid, pyrophsphoric acid, polyphosphoric acid having at least 3 Ps and metaphosphoric acid.

The etching composition additive is produced through a reaction of 0.1 part by weight to 10 parts by weight of the silane compound based on 100 parts by weight of the phosphoric anhydride, and preferably contains silyl phosphate.

As another aspect, a method for preparing silyl phosphate for an etching composition additive is provided. The method includes preparing a mixture comprising phosphoric anhydride and a silane compound of Formula 1 and reacting the mixture to prepare a silyl phosphate compound:

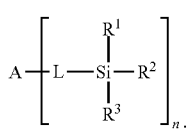

[Formula 1]

In Formula 1, A is an n-valent radical, and L is a direct bond or $C_1$-$C_3$ hydrocarbylene, while $R^1$ to $R^3$ are independently hydrogen, hydroxy, $C_1$-$C_{20}$ hydrocarbyl or $C_1$-$C_{20}$ alkoxy; and n is an integer of 2 to 5. The silane compound of Formula 1 excludes siloxane.

It is preferable that in Formula 1. $R^1$ to $R^3$ may be independently $C_1$-$C_{20}$ alkoxy.

In Formula 1, the A may be $C_1$-$C_{20}$ hydrocarbylene, an amine salt radical, a radical having N as a binding site, a radical having O as a binding site, a radical having S as a binding site, a radical having P as a binding site.

In Formula 1, the A may be $*-N^+(R^{11}R^{12})X_1^--*$,

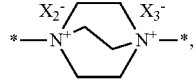

$*-NR^{13}-*$, $*-NR^{14}L_1R^{15}-*$, $*-NR^{16}CONR^{17}-*$, $*-NR^{18}CSNR^{19}-*$, $-NR^{20}CONR^{21}L_2NR^{22}CONR^{23}-*$, $*-NR^{24}CONL_3L_4NCONR^{25}-*$,

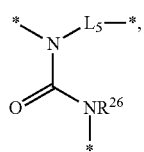

$*-O-*$, $*-S-*$, $*-S-S-*$,

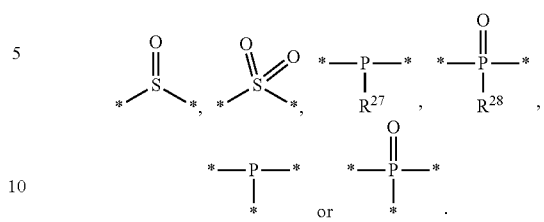

$X_1$ to $X_3$ are independently halogen or a $C_1$-$C_{20}$ alkyl carbonate group, and $R^{11}$ to $R^{26}$ are independently hydrogen, $C_1$-$C_{20}$ alkyl or $C_6$-$C_{20}$ aryl, while $R^{27}$ and $R^{28}$ are independently hydrogen, $C_1$-$C_{20}$ alkyl, $C_6$-$C_{20}$ aryl, $C_1$-$C_{20}$ alkoxy or $C_1$-$C_{20}$ alkyl$C_1$-$C_{20}$ alkoxy. $L_1$ to $L_4$ are $C_1$-$C_{20}$ alkylene, $C_6$-$C_{20}$ arylene or $R^{31}(OR^{32})_p$, where $R^{31}$ and $R^{32}$ are independently $C_1$-$C_{20}$ alkylene, and p is an integer of 1 to 5. $L_5$ is a direct bond or $(CH_2)_qNR^{33}NR^{34}$, where $R^{33}$ and $R^{34}$ are independently hydrogen, $C_1$-$C_{20}$ alkyl or $C_6$-$C_{20}$ aryl, and q is an integer of 1 to 5.

It is more preferable that in Formula 1, that n may be 2 or 3.

The silane compound may be at least one selected from following Structural Formulae 1 to 26:

(1)

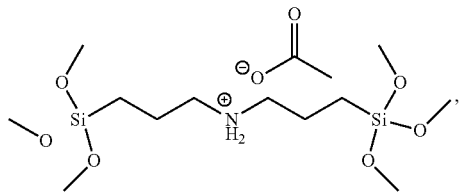

(2)

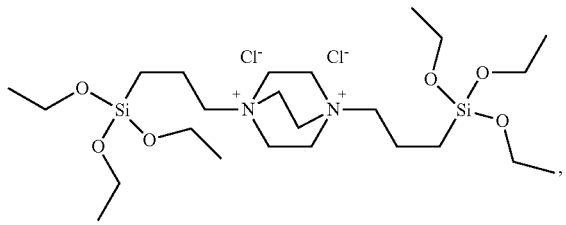

(3)

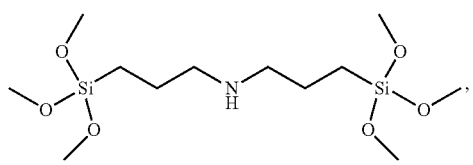

(4)

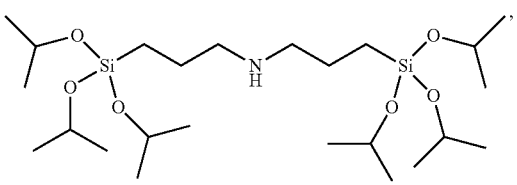

(5)

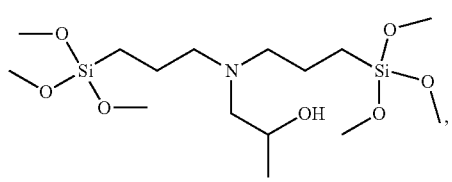

(6)

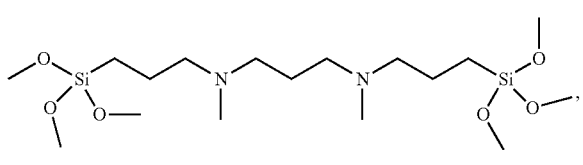

(7)

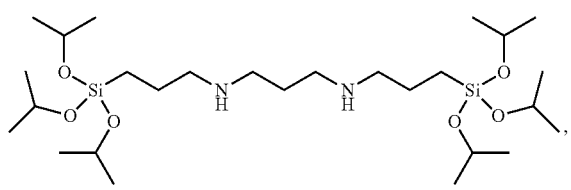

(8)

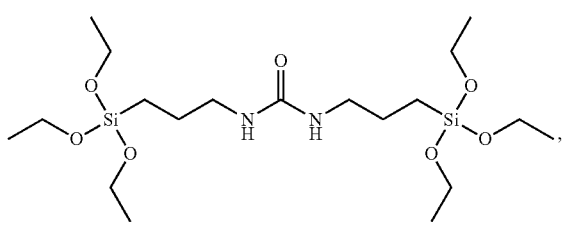

(9)
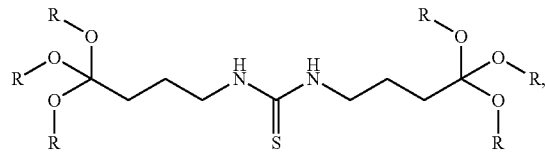
(10)
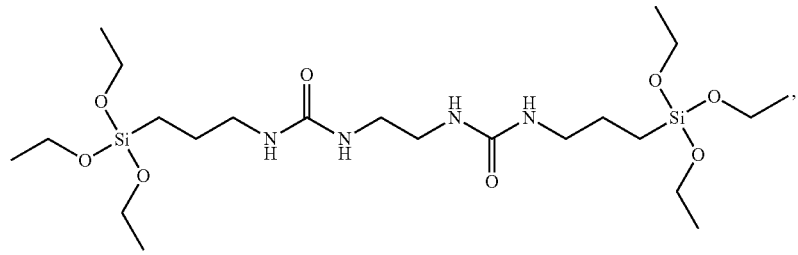
(11)
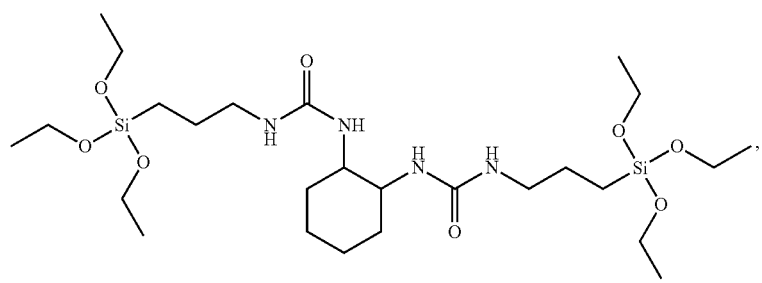
(12)
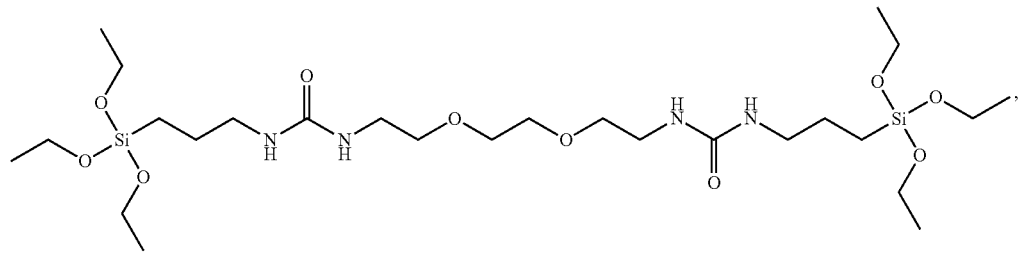
(13)
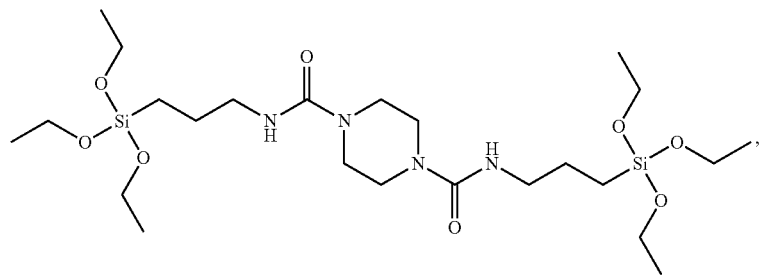
(14)
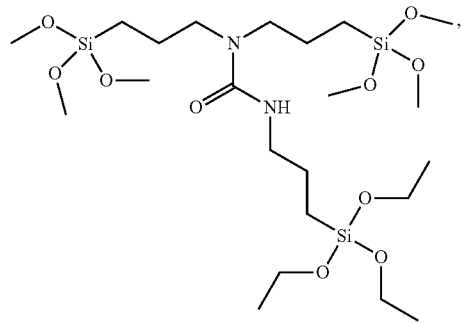

-continued

(15) 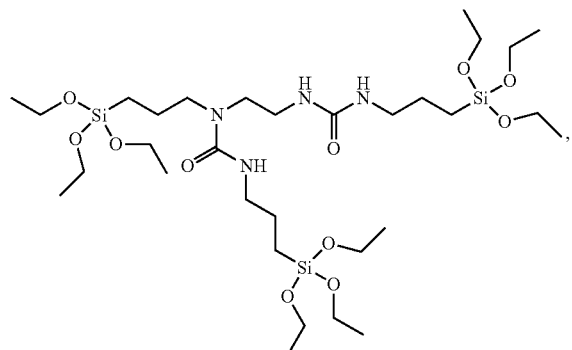

(16) 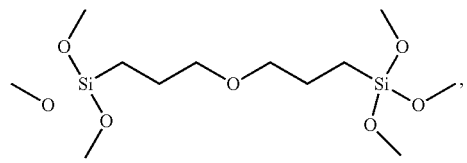

(17) 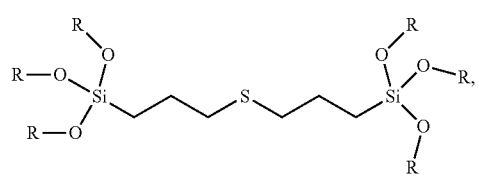

(18) 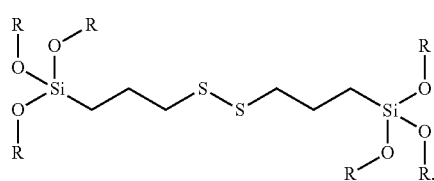

(19) 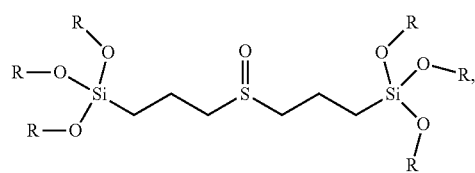

(20) 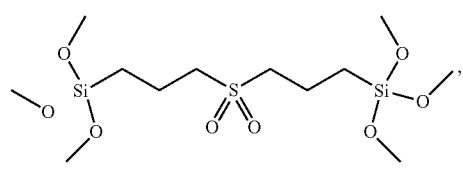

(21) 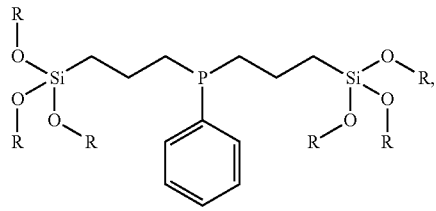

(22) 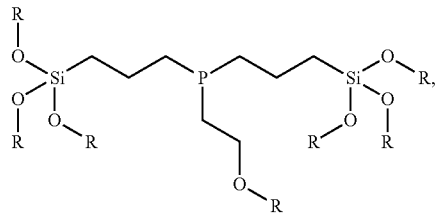

(23) 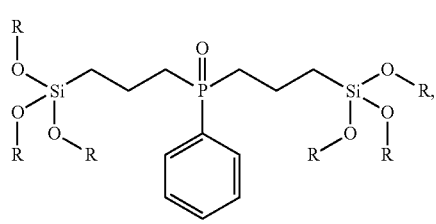

(24) 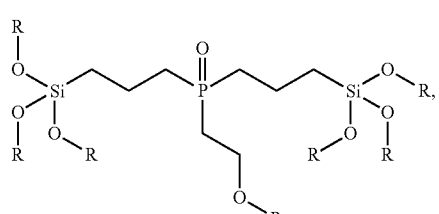

(25) 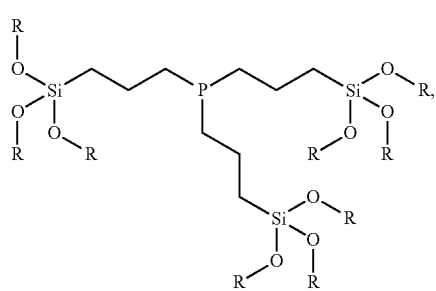

(26) 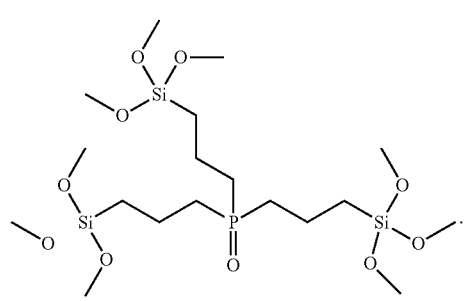

wherein, in the above formulae, R is hydrogen, $C_1$-$C_{20}$ alkyl or $C_6$-$C_{20}$ aryl.

The phosphoric anhydride may be at least one selected from the group consisting of water-removed pure phosphoric acid, pyrophsphoric acid, polyphosphoric acid having at least 3 Ps and metaphosphoric acid.

The phosphoric anhydride may be phosphoric acid from which water is removed by heating at a temperature in the range of 180° C. to 220° C.

The mixture may contain 100 parts by weight of the phosphoric anhydride and 0.1 part by weight to 10 parts by weight of the silane compound based on 100 parts by weight of the phosphoric anhydride.

The reaction may be carried out at a temperature in the range of 20° C. to 200° C.

An etching composition is also provided. The etching composition includes phosphoric acid, silyl phosphate for the etching composition additive as described above or silyl phosphate for the etching composition additive prepared by the method described above, and a solvent.

The etching composition additive may contain 0.01 wt % to 10 wt % silyl phosphate.

The etching composition may contain 70 wt % to 89 wt % phosphoric acid, 0.01 wt % to 10 wt % etching composition additive and 11 wt % to 30 wt % solvent.

The etching composition may further contain a silane compound represented by Formula 2 below:

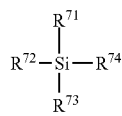
[Formula 2]

In Formula 2, $R^{71}$ to $R^{74}$ are independently hydrogen, hydrocarbyl or heterohydrocarbyl, and $R^{71}$ to $R^{74}$ may individually exist or two or more thereof form a ring, connected by a heteroelement.

Further, the etching composition may further include an ammonium salt.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
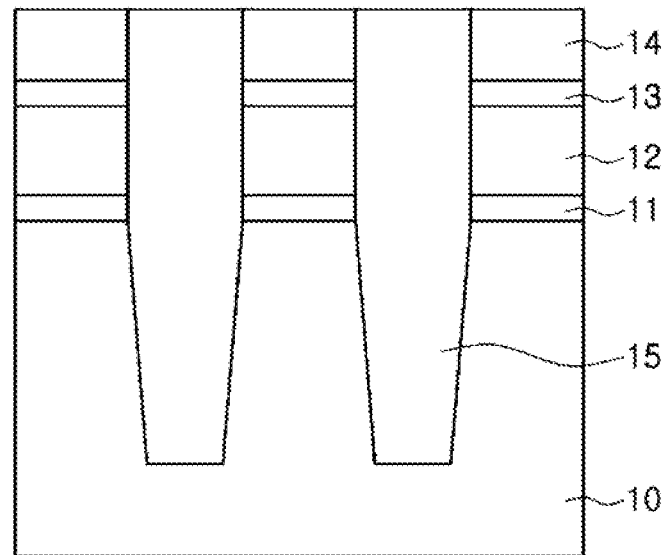
FIGS. 1 and 2 are cross-sectional views showing a device separation process of a flash memory device.

The present disclosure is to provide an etching composition having a high selection ratio enabling selective removal of a nitride film while minimizing an etching rate of an oxide film and also having excellent storage stability.

The etching composition of the present disclosure contains phosphoric acid, an additive and a solvent.

The phosphoric acid etches a nitride through a reaction with silicon nitride. The phosphoric acid etches the silicon nitride by reacting as shown in formula (1) below:

$$3Si_3N_4+27H_2O+4H_3PO_4 \rightarrow 4(NH_4)_3PO_4+9SiO_2H_2O \quad (1)$$

It is preferable that the phosphoric acid be contained in an amount of 70 wt % to 89 wt % based on the total weight of the etching composition. In the case of being contained in an amount of less than 70 wt %, a nitride film is not easily removed, whereas in the case of being contained in an amount greater than 89 wt %, a high selection ratio cannot be obtained for the nitride film.

The etching composition of the present disclosure contains as an additive a product produced by reacting phosphoric anhydride with a silane compound represented by following Formula 1:

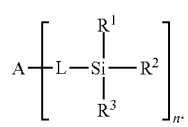
[Formula 1]

In Formula 1, $R^1$ to $R^3$ may be independently hydrogen, hydroxy, $C_1$-$C_{20}$ hydrocarbyl or $C_1$-$C_{20}$ alkoxy. More specifically, $R^1$ to $R^3$ may be $C_1$-$C_{20}$ alkoxy.

The L may be a direct bond or $C_1$-$C_3$ hydrocarbylene, more specifically, $C_1$-$C_3$ alkylene.

Further, the n may be an integer of 2 to 5.

Meanwhile, the A represents an n-valent radical. For example, the A may be $C_1$-$C_{20}$ hydrocarbylene, an amine salt radical, a radical having N as a binding site, a radical having O as a binding site, a radical having S as a binding site, a radical having P as a binding site, or the like. Such silane compound has a structure including 2 or more silicones, thereby providing a high selection ratio for the nitride film and significantly preventing gelation of an etchant, and thus is preferable.

The A may be an amine salt radical, specifically *—$N^+$($R^{11}R^{12}$)$X_1^-$—* or

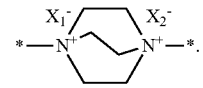

$X_1$ to $X_3$ are independently halogen or a $C_1$-$C_{20}$ alkyl carbonate group.

Although not particularly limited, the silane compound having the amine salt radical and in which n is an integer of 2 may have following Structure Formula (1) or (2):

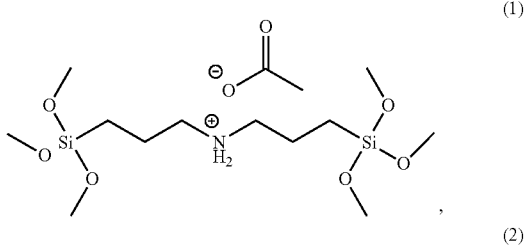
(1)

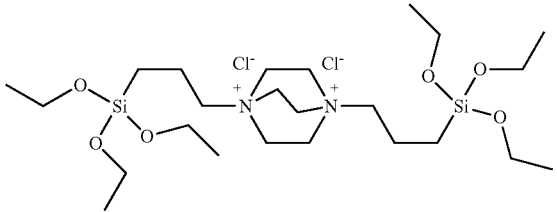
(2)

The A may be a radical having N as a binding site. When is an integer of 2, the radical having N as a binding site may be *—$NR^{13}$—* such as *—NH—* and *—$NCH_2CHOHCH_3$—*; *—$NR^{14}L_1NR^{15}$—* such as *—$NH(CH_2)_3NH$—* or *—$NCH_3(CH_2)_3NCH_3$—*; *—$NR^{16}CONR^{17}$—* such as *—NHCONH—*; *—$NR^{18}CSNR^{19}$—* such as *—NHCSNH—*; *—$NR^{20}CONR^{21}L_2NR^{22}CONR^{23}$—* such as

*—NHCONH(CH$_2$)$_2$NHCONH—*,  *—NHCONH(C$_6$H$_4$)NHCONH—* or *—NHCONH(CH$_2$)$_2$O(CH$_2$)$_2$O(CH$_2$)$_2$NHCONH—*;  —NR$^{24}$CONL$_3$L$_4$NCONR$^{25}$—* such as *—NHCON(CH$_2$)$_2$(CH$_2$)$_2$NCONH—*, or the like.

The R$^{13}$ to R$^{25}$ may independently be hydrogen, C$_1$-C$_{20}$ alkyl or C$_6$-C$_{20}$ aryl, and L$_1$ to L$_4$ are C$_1$-C$_{20}$ alkylene, C$_6$-C$_{20}$ arylene or R$^{31}$ (OR$^{32}$)$_p$. R$^{31}$ and R$^{32}$ are independently C$_1$-C$_{20}$ alkylene, and p is an integer of 1 to 5.

Such silane compound, in which n is an integer of 2 and the radical having N as a binding site, may, for example, have following Structural Formulae (3) to (13):

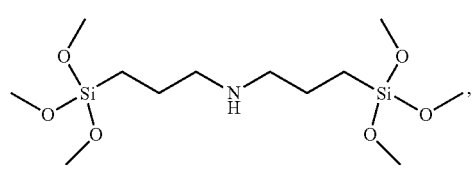
(3)

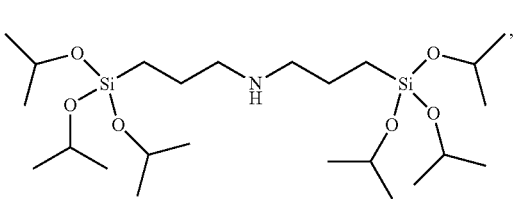
(4)

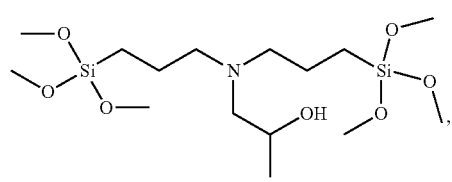
(5)

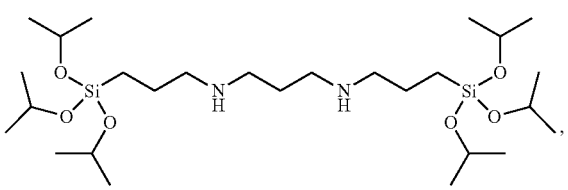
(6)

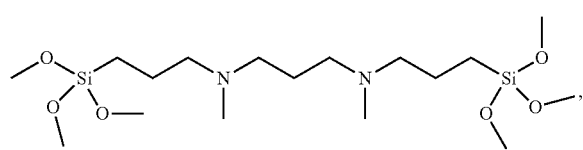
(7)

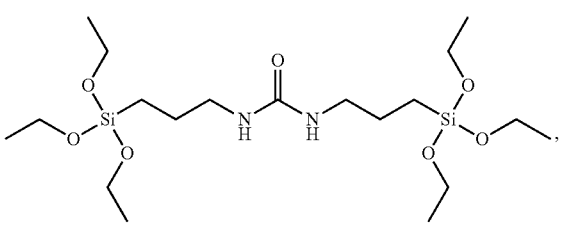
(8)

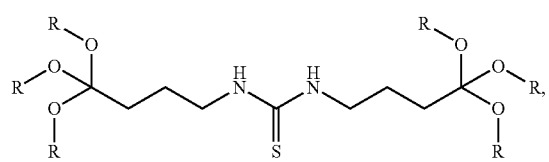
(9)

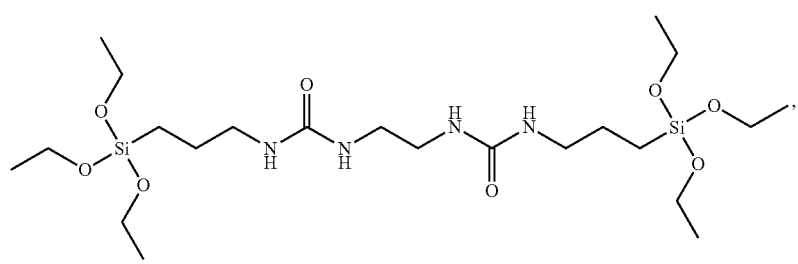
(10)

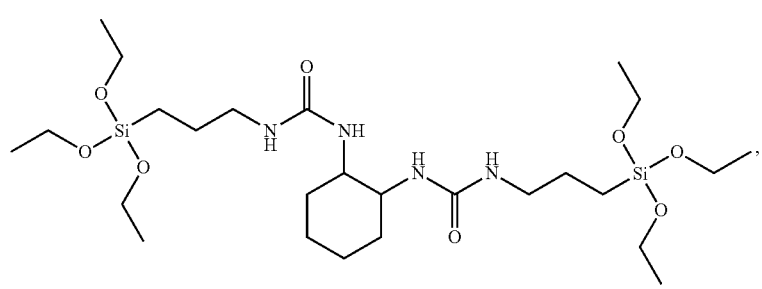
(11)

-continued

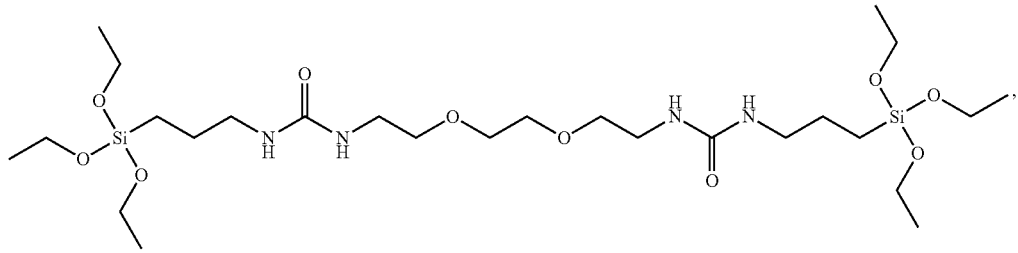

(12)

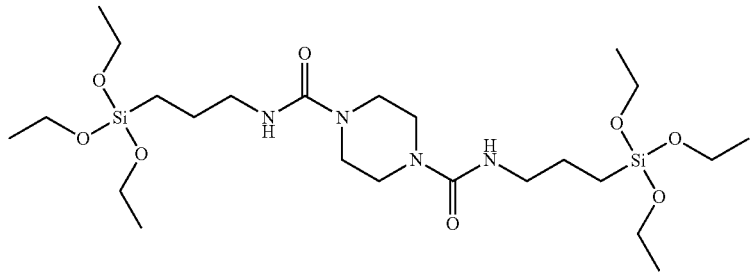

(13)

Meanwhile, when n is an integer of 3, the radical having N as a binding site may be

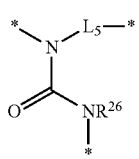

The $R^{26}$ may be hydrogen, $C_1$-$C_{20}$ alkyl or $C_6$-$C_{20}$ aryl, and $L_5$ is a direct bond or $(CH_2)_q NR^{13} NR^{14}$, where $R^{13}$ and $R^{14}$ are independently hydrogen, $C_1$-$C_{20}$ alkyl or $C_6$-$C_{20}$ aryl, and q is an integer of 1 to 5.

Such silane compound, in which n is an integer of 3 and the radical having N as a binding site, may have following Structural Formulae (14) and (15):

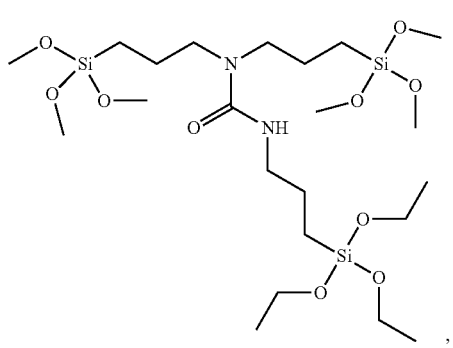

(14)

-continued

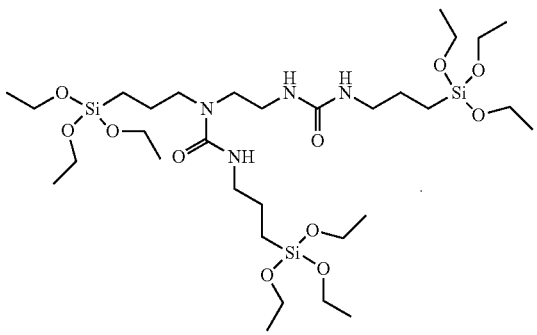

(15)

Further, the A may be a radical having O as a binding site, and may specifically be *—O—*. Although not limited, the silane compound, in which n is an integer of 2 and the radical having O as a binding site, may have following Structural Formula (16):

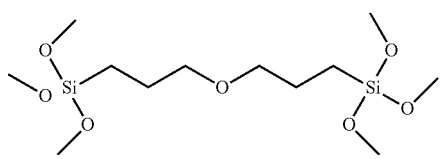

(16)

The A may be a radical having S as a binding site, and may specifically be *—S—*, *—S—S—*,

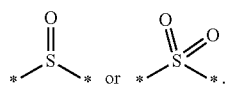

Although not limited, the silane compound, in which n is an integer of 2 and the radical having S as a binding site, may have following Structural Formulae (17) to (20):

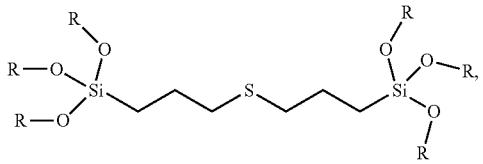
(17)

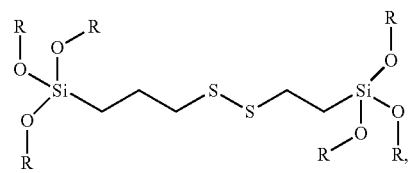
(18)

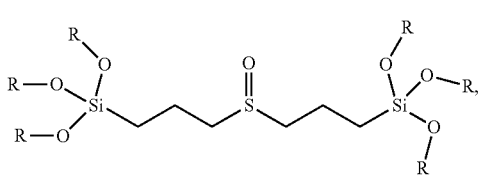
(19)

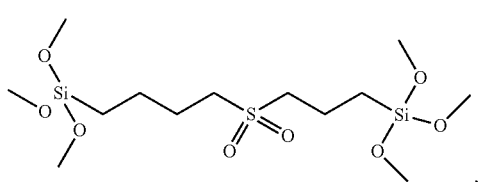
(20)

where in the structural formulae above, R is hydrogen, $C_1$-$C_{20}$ alkyl or $C_6$-$C_{20}$ aryl.

The A may be a radical having P as a binding site, and may specifically be

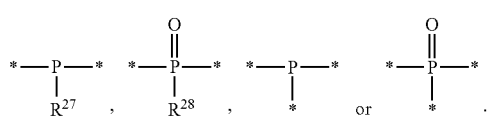

Although not limited, the silane compound, in which n is an integer of 2 or 3 and the radical having P as a binding site, may have following Structural Formulae (21) to (26):

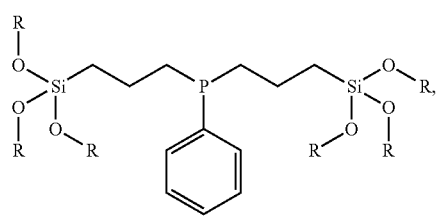
(21)

-continued

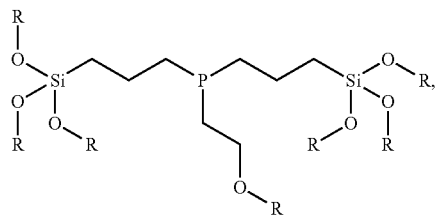
(22)

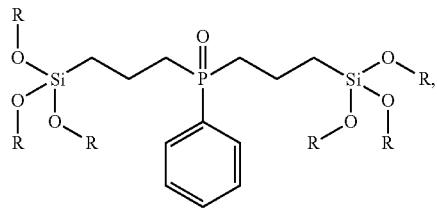
(23)

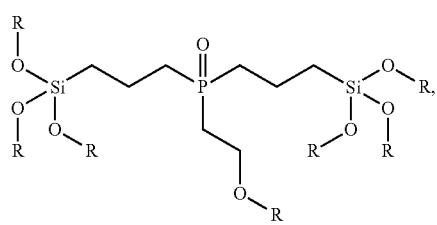
(24)

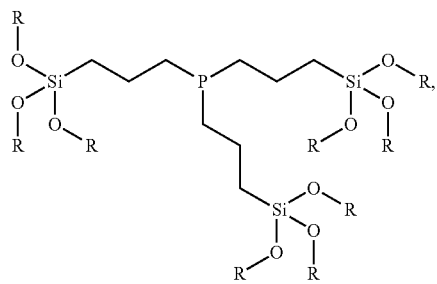
(25)

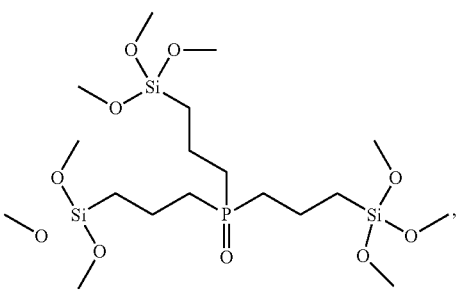
(26)

where in the structural formulae above, R is hydrogen, $C_1$-$C_{20}$ alkyl or $C_6$-$C_{20}$ aryl.

Use of such silane compounds having at least 2 silicone atoms increases a number of hydroxide groups attached thereto, which will passivate a surface of a silicon oxide during the etching process and thus reduce an etching rate of the oxide film.

Meanwhile, it is preferable that the silane compound not be siloxane. A siloxane compound has low solubility to a solvent and thus is not dissolved and precipitated, or induces gelation of an etching composition, and thus is not preferable. Accordingly, the siloxane compound, in which L is a direct bond and A is a radical having O as a binding site in Formula 1 above, is excluded.

The etching composition of the present disclosure includes a product produced through a reaction of the compound of Formula 1 and phosphoric anhydride as an additive. Although not particularly limited, the phosphoric anhydride may be any one of water-removed pure phosphoric acid, pyrophsphoric acid, polyphosphoric acid having at least 3 Ps and metaphosphoric acid as long as it is phosphoric acid from which water is completely removed, and may be used alone or in a combination of two or more. The phosphoric anhydride can be obtained by heating phosphoric acid at a temperature of 180° C. to 220° C. to remove water.

Furthermore, silyl phosphate can be produced by reacting phosphoric anhydride with the silane compound. The reaction of the phosphoric anhydride with the silane compound of Formula 1 may be carried out at a temperature in the range of 20° C. to 200° C. while removing a reaction byproduct such as methanol or ethanol.

It is preferable that 0.1 part by weight to 10 parts by weight of the silane compound of Formula 1 is mixed to react based on 100 parts by weight of the phosphoric anhydride. When the silane compound is contained in an amount of less than 0.1 part by weight, the amount of the silane compound is excessively little that a high selection ratio cannot be obtained for the nitride film, whereas when the silane compound is contained in an amount of greater than 10 parts by weight, the compound is not dissolved in the phosphoric anhydride and may be precipitated as particles. The silane compound may be included in an amount of, for example, 0.1 part by weight to 7 parts by weight, 0.5 part by weight to 7 parts by weight, 1 part by weight to 7 parts by weight, 1 part by weight to 5 parts by weight, 3 part by weight to 5 parts by weight, or the like, based on 100 parts by weight of the phosphoric anhydride.

In the case in which a hydrophilic functional group is linked to a silicon atom as the silane compound of Formula 1, the silane compound reacts with water and is substituted with a hydroxyl group to form a silicon-hydroxyl group (—Si—OH). Such silicon-hydroxyl group produces a siloxane group (—Si—O—Si—) by polymerization, resulting in abnormal growth and precipitation of the silicon-based particles.

Undissolving and precipitation of the silane-based additives due to hydrolysis and polycondensation, caused by water, the solvent, can be prevented by including silyl phosphate of the present disclosure in the etching composition, thereby improving solution stability. In addition, the silyl phosphate has two or more silane functional groups, and can effectively protect a silicon oxide film even with a small amount thereof, thereby improving etching selectivity of the nitride to the oxide film.

The silyl phosphate may be contained in an amount of 0.001 wt % to 1 wt % based on the total weight of the etching composition. When the silyl phosphate is contained in an amount of less than 0.001 wt %, the silane content is too low, thereby making it difficult to obtain a high selection ratio for the nitride, whereas when the silyl phosphate is contained in an amount of greater than 1 wt %, there is no additionally increasing effect in accordance with an increasing amount of the silyl phosphate being added. The silyl phosphate may be added in an amount of, for example, 0.001 wt % or more, 0.002 wt % or more, 0.003 wt % or more, 0.005 wt % or more, 0.01 wt % or more, 0.03 wt % or more, 0.05 wt % or more or 0.1 wt % or more and 0.3 wt % or less, 0.5 wt % or less, 0.7 wt % or less, 1 wt % or less, 5 wt % or less or 10 wt % or less.

The etching composition of the present disclosure may include phosphoric anhydride in addition to silyl phosphate, a product of the reaction between the phosphoric anhydride and the silane compound of Formula 1. For example, silyl phosphate is produced through a reaction between phosphoric anhydride and the silane compound of Formula 1 and can be added as an additive for etching composition while containing unreacted phosphoric anhydride.

The additive for etching composition may contain silyl phosphate in an amount of 0.01 wt % to 10 wt %. When the silyl phosphate is contained in an amount of less than 0.01 wt, the selection ratio for the nitride film may be reduced, whereas the silyl phosphate in an amount of greater than 10 wt % may cause gelation of the solution. More preferably, the silyl phosphate may be contained in an amount of 0.05 wt % or more, 0.1 wt % or more, 0.5 wt % or more or 0.7 wt % or more and 1.2 wt % or less, 1.5 wt % or less, 3 wt % or less, 5 wt % or less, or 7 wt % or less.

The additive for etching composition containing the silyl phosphate and the phosphoric anhydride may be included in an amount of 0.01 wt % to 10 wt % based on the total weight of the etching composition. This is preferable as gelation of the etching composition can be prevented in said range. As a specific example, the etching composition additive may be included in an amount of 0.01 wt % or more, 0.05 wt % or more, 0.1 wt % or more, 0.3 wt % or more, 0.5 wt % or more, 0.7 wt % or more or 1 wt % or more and 1 wt % or less, 3 wt % or less, 5 wt % or less, 7 wt % or less or 10 wt % or less.

The etching composition of the present disclosure may further include a silane compound represented by Formula 2 below:

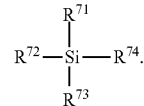

[Formula 2]

In Formula 2, $R^{71}$ to $R^{74}$ may be independently hydrogen, hydrocarbyl or heterohydrocarbyl, and $R^{71}$ to $R^{74}$ may individually exist or two or more thereof form a ring, connected by a heteroelement. For example, $R^{71}$ to $R^{74}$ may be hydrogen, $C_1$-$C_{20}$ alkyl, $C_1$-$C_{20}$ heteroalkyl, or the like. The heteroelement is not particularly limited, but may be nitrogen (N), sulfur (S), oxygen (O), phosphorous (P), or the like.

The silane compound represented by Formula 2 may be included in an amount of 0.005 wt % to 10 wt %, based on the total weight of the etching composition.

Further, an ammonium salt may also be added to the etching composition of the present disclosure. The ammonium salt can prevent gelation of the etching composition, and may be added in an amount of 0.001 wt % to 10 wt %, based on the total weight. When less than 0.001 wt % of the ammonium salt is added, a physical property improvement of decreased gelation is insignificant. When added in an amount of more than 10 wt %, the ammonium salt may cause the gelation.

The ammonium salt is a compound having an ammonium ion, and those conventionally used in the art may be appropriately used in the present disclosure as well. Although not particularly limited, the ammonium salt may be, for example, ammonia water, ammonium chloride, ammonium acetate, ammonium phosphate, ammonium peroxydisulfate, ammonium sulfate, ammonium fluorate, or the like. These may be used alone or in a combination of two or more.

Furthermore, the etching composition of the present disclosure may further include an optional additive conventionally used in the art to further improve etching performance. The additive may be a surfactant, a metal ion sequestrant, a corrosion inhibitor, or the like.

The etching composition includes a solvent and may include the solvent in an amount of 11 wt % to 30 wt %. The solvent is not particularly limited, but may be water.

The etching composition of the present disclosure is used for selective removal of a nitride film by etching from a semiconductor device including an oxide film and a nitride film. The nitride film may include a silicon nitride film, for example, a SiN film, a SiON film, or the like.

In addition, the oxide film may be at least one film selected from the group consisting of a silicon oxide film, for example, a spin on dielectric (SOD) film, a high density plasma (HDP) film, a thermal oxide film, a borophosphate silicate glass (BPSG) film, a phosphosilicate glass (PSG) film, a borosilicate glass (BSG) film, a polysilazane (PSZ) film, a fluorinated silicate glass (FSG) film, a low pressure tetraethyl orthosilicate (LPTEOS) film, a plasma enhanced tetraethyl orthosilicate (PETEOS) film, a high temperature oxide (HTO) film, a medium temperature oxide (MTO) film, an undoped silicate glass (USG) film, a spin on glass (SOG) film, an advanced planarization layer (APL) film, an atomic layer deposition (ALD) film, a plasma enhanced oxide (PE-oxide) film, an O3-tetraethyl orthosilicate (O3-TEOS) film or combinations thereof.

An etching process using the etching composition of the present disclosure may be performed by a wet etching method, for example, a dipping method, a spraying method, or the like.

Figure 2:
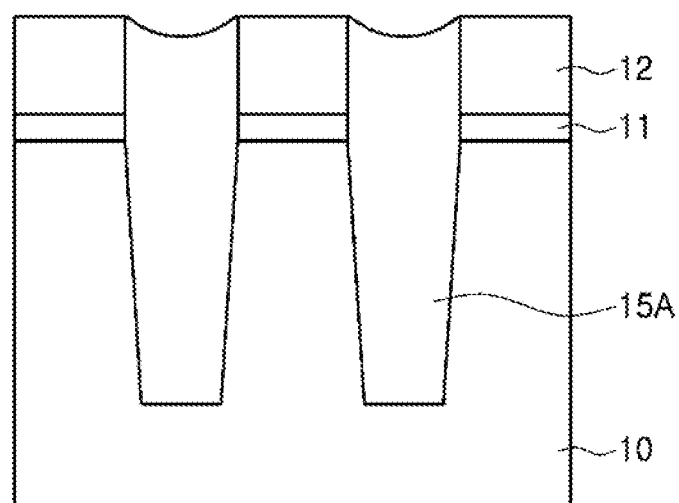

An example of an etching process using the etching composition of the present disclosure is schematized in FIGS. 1 and 2. FIGS. 1 and 2 are example process sectional views showing a device separation process of a flash memory device.

As shown in FIG. 1, a tunnel oxide film 11, a polysilicon film 12, a buffer oxide film 13, and a pad nitride film 14 are formed in turn on a substrate 10, and then the polysilicon film 12, the buffer oxide film 13 and the pad nitride film 14 are selectively etched to form a trench. Subsequently, an SOD oxide film 15 is formed until the trench is gap-filled, and a CMP process is then carried out on the SOD oxide film 15 using the pad nitride film 14 as a polishing stop film.

As shown in FIG. 2, the pad nitride film 14 is removed by wet etching using the etching composition previously described, and the buffer oxide film 13 is then removed by a washing process. As a result, a device separation film 15A is formed in a field area.

The etching process using the etching composition may be performed by a wet etching method well known in the art, for example, dipping, spraying, or the like.

A temperature of the etching process may be in a range of 50° C. to 300° C., preferably 100° C. to 200° C., more preferably 156° C. to 163° C., and an appropriate temperature may be changed, if necessary, in consideration of other processes and factors.

As such, according to a method for manufacturing a semiconductor device including the etching process carried out using the etching composition of the present disclosure, selective etching of the nitride film is feasible when the nitride film and the oxide film are alternately stacked or mixed.

In addition, stability and reliability can be secured by preventing the occurrence of particles, which was problematic in the conventional etching process.

Accordingly, such method may be efficiently applied to various processes requiring selective etching of the nitride film to the oxide film in the semiconductor device-manufacturing process.

Example

Hereinafter, the present disclosure will be described in detail by way of examples. The following Examples relate to an example of the present disclosure, but the present disclosure is not limited thereto.

Synthesis Example 1—Preparation of Silane Compound 1

A stirring bar was added to a 100 mL round bottom flask and a reflux condenser was installed. 7.29 g of 1,4-diazacyclo[2.2.2]octane (DABCO), 15 mL of DMF, and 37 mL of (3-chloropropyl)triethoxysilane were added thereto.

While maintaining nitrogen atmosphere, a temperature was increased to 105° C. After 24 hours of stirring, the mixture was cooled to room temperature.

50 mL of normal hexane was added thereto and re-slurried, followed by filtration.

After filtration, a solid was washed with 50 mL of normal hexane and vacuum-dried to obtain 32.8 g of a silane compound (Silane Compound 1) as shown in the formula below;

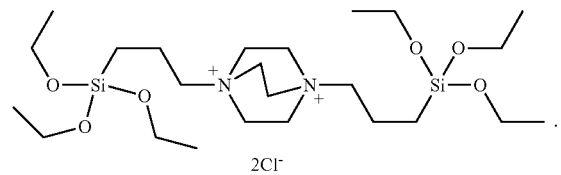

$^1$H-NMR (CDCl$_3$) 3.81~3.76 (m, 12H), 3.66~3.63 (m, 4H), 3.55 (t, J=7.0 Hz, 4H), 3.44~3.41 (m, 4H), 3.25 (t, J=7.0 Hz, 4H), 1.94~1.79 (m, 4H), 1.19 (t, J=2.5 Hz, 18H), 0.60 (t, J=7.0 Hz, 4H)

Synthesis Example 2—Preparation of Silane Compound 2

A stirring bar was added to a 50 mL round bottom flask, followed by adding 3.4 g of bis(3-trimethoxysilylpropyl) amine and 15 mL of dichloromethane.

While maintaining nitrogen atmosphere, the mixture was cooled to 0° C. 2.5 g of 3-(triethoxysilyl)propyl isocyanate was added thereto for 30 minutes and stirred for an hour. The mixture was increased to room temperature.

After drying under reduced pressure, 5.7 g of a silane compound (Silane Compound 2) having the following structural formula was obtained:

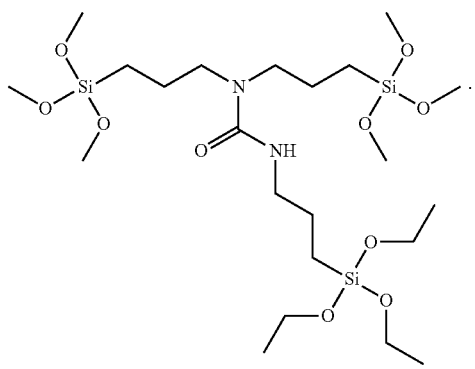

$^1$H-NMR (CDCl$_3$) 4.91 (br, 1H), 3.82 (q, J=7.0 Hz, 6H), 3.58 (s, 18H), 3.21 (quint, J=7.0 Hz, 2H), 3.17 (t, J=8.0 Hz, 4H), 1.66~1.60 (m, 6H), 1.22 (t, J=7.0 Hz, 9H), 0.66~0.59 (m, 6H)

Synthesis Example 3—Preparation of Silane Compound 3

A stirring bar was added to a 100 mL round bottom flask. 11.1 g of 3-(aminopropyl)triethoxysilane and 30 mL of dichloromethane were added thereto.

While maintaining nitrogen atmosphere, the mixture was cooled to 0° C. 12.4 g of 3-(triethoxysilyl)propyl isocyanate was added thereto for 30 minutes and stirred for an hour. The mixture was increased to room temperature.

After drying under reduced pressure, 23.0 g of a silane compound (Silane Compound 3) having the following structural formula was obtained:

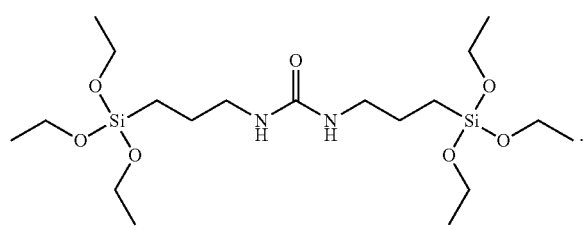 [SMILES: CCO[Si](CCCNC(=O)NCCC[Si](OCC)(OCC)OCC)(OCC)OCC]

$^1$H-NMR (CDCl$_3$) 4.48 (br, 2H), 3.81 (q, J=7.0 Hz, 12H), 3.15 (q, J=7.0 Hz, 4H), 1.16 (quint, J=7.5 Hz, 4H), 1.22 (t, J=7.0 Hz, 18H), 0.63 (t, J=8.5 Hz, 4H)

Synthesis Example 4—Preparation of Silane Compound 4

A stirring bar was added to a 50 mL round bottom flask. 2.0 g of 1,3-dibromopropane and 5.8 g of trimethoxy[3-(methoylamino)propyl]silane were added.

After 6 hours of stirring, 50 mL of toluene was added. 10 mL of saturated sodium hydrogen carbonate solution was then added and stirred for 10 minutes.

After isolating an organic layer, the organic layer was dried with sodium sulfate and further dried under reduced pressure to obtain 1.1 g of a silane compound (Silane Compound 4) having the following structural formula was obtained:

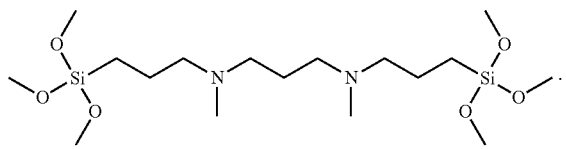

$^1$H-NMR (CDCl$_3$) 3.57 (s, 18H), 2.33 (quint, J=7.0 Hz, 8H), 2.21 (s, 6H), 1.67~1.54 (m, 6H), 0.64~0.61 (m, 4H)

Synthesis Example 5—Preparation of Silane Compound 5

A stirring bar was added to a 100 mL round bottom flask. 4.2 g of ethylenediamine and 50 mL of dichloromethane were added thereto.

While maintaining nitrogen atmosphere, the mixture was cooled to 0° C. 34.4 g of 3-(triethoxysilyl)propyl isocyanate was added thereto for 30 minutes.

After stirring for an hour, the temperature was increased to room temperature. After drying under reduced pressure, 38.4 g of a silane compound (Silane Compound 5) having the following structural formula was obtained.

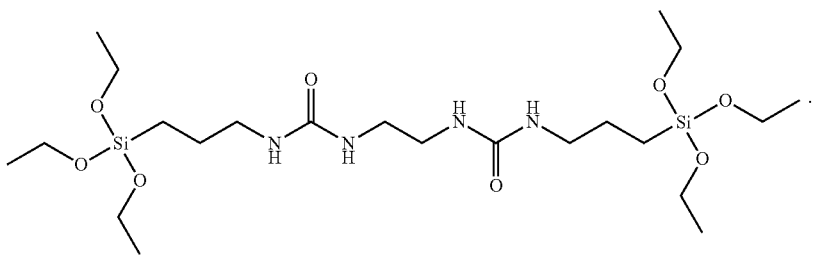 [SMILES: CCO[Si](CCCNC(=O)NCCNC(=O)NCCC[Si](OCC)(OCC)OCC)(OCC)OCC]

$^1$H-NMR (CDCl$_3$) 5.34 (br, 2H), 4.89 (br, 2H), 3.81 (q, J=7.0 Hz, 12H), 3.27 (br, 4H), 3.13 (q, J=7.0 Hz, 4H), 1.60 (quint, J=7.5 Hz, 4H), 1.22 (t, J=7.0 Hz, 18H), 0.63 (t, J=8.5 Hz, 4H)

Examples

Comparative Example 1

3-Aminopropyl silanetriol was added to an aqueous phosphoric acid solution as an etching additive to prepare an etching composition.

The etching composition consists of 85 wt % phosphoric acid, 0.5 wt % of the etching additive and a remainder of water as shown in Table 1.

Reference Example 1

The Silane Compound 1 obtained in Synthesis Example 1 was added to the aqueous phosphoric acid solution as an etching additive to prepare an etching composition.

The etching composition consists of 85 wt % phosphoric acid, 0.5 wt % of the etching additive of Silane Compound 1, and a remainder of water as shown in Table 1.

Example 1

Metaphosphoric acid was heated at 200° C. to completely remove water so as to prepare metaphosphoric anhydride.

5 parts by weight of the Silane Compound 1 obtained in Synthesis Example 1 was added to 100 parts by weight of the metaphosphoric anhydride, followed by heating at a temperature of 120° C. to remove ethanol, a reaction byproduct, to prepare an etching composition additive (Additive 1) containing silyl phosphate.

Thus-prepared Additive 1 was added to the aqueous phosphoric acid solution to prepare an etching composition.

The etching composition consists of 85 wt % phosphoric acid, 0.5 wt % of Additive 1 and a remainder of water as shown in Table 1.

Example 2

Metaphosphoric acid was heated at 200° C. to completely remove water so as to prepare metaphosphoric anhydride.

5 parts by weight of the Silane Compound 2 obtained in Synthesis Example 2 was added to 100 parts by weight of the metaphosphoric anhydride, followed by heating at a temperature of 120° C. to remove ethanol, a reaction byproduct, to prepare an Additive 2 containing silyl phosphate.

Thus-prepared Additive 2 was added to the aqueous phosphoric acid solution to prepare an etching composition.

The etching composition consists of 85 wt % phosphoric acid, 0.5 wt % of Additive 2 and a remainder of water as shown in Table 1.

Example 3

Metaphosphoric acid was heated at 200° C. to completely remove water so as to prepare metaphosphoric anhydride.

5 parts by weight of the Silane Compound 3 obtained in Synthesis Example 3 was added to 100 parts by weight of the metaphosphoric anhydride, followed by heating at a temperature of 120° C. to remove ethanol, a reaction byproduct, to prepare an Additive 3 containing silyl phosphate.

Thus-prepared Additive 3 was added to the aqueous phosphoric acid solution to prepare an etching composition.

The etching composition consists of 85 wt % phosphoric acid, 0.5 wt % of Additive 3 and a remainder of water as shown in Table 1.

Example 4

Metaphosphoric acid was heated at 200° C. to completely remove water so as to prepare metaphosphoric anhydride.

5 parts by weight of the Silane Compound 4 obtained in Synthesis Example 4 was added to 100 parts by weight of the metaphosphoric anhydride, followed by heating at a temperature of 120° C. to remove ethanol, a reaction byproduct, to prepare an Additive 4 containing silyl phosphate.

Thus-prepared Additive 4 was added to the aqueous phosphoric acid solution to prepare an etching composition.

The etching composition consists of 85 wt % phosphoric acid, 0.5 wt % of Additive 4 and a remainder of water as shown in Table 1.

Example 5

Metaphosphoric acid was heated at 200° C. to completely remove water so as to prepare metaphosphoric anhydride.

5 parts by weight of the Silane Compound 5 obtained in Synthesis Example 5 was added to 100 parts by weight of the metaphosphoric anhydride, followed by heating at a temperature of 120° C. to remove ethanol, a reaction byproduct, to prepare an Additive 5 containing silyl phosphate.

Thus-prepared Additive 5 was added to the aqueous phosphoric acid solution to prepare an etching composition.

The etching composition consists of 85 wt % phosphoric acid, 0.5 wt % of Additive 5 and a remainder of water as shown in Table 1.

TABLE 1

| | Phosphoric acid | Additives | | Water |
|---|---|---|---|---|
| | | Types | Contents | |
| Comp. Ex. 1 | 85 wt % | 3-aminopropyl-silanetriol | 0.5 wt % | 14.5 wt % |
| Ref. Ex. 1 | 85 wt % | Silane compound 1 | 0.5 wt % | 14.5 wt % |
| Example 1 | 85 wt % | Additive 1 | 0.5 wt % | 14.5 wt % |
| Example 2 | 85 wt % | Additive 2 | 0.5 wt % | 14.5 wt % |
| Example 3 | 85 wt % | Additive 3 | 0.5 wt % | 14.5 wt % |
| Example 4 | 85 wt % | Additive 4 | 0.5 wt % | 14.5 wt % |
| Example 5 | 85 wt % | Additive 5 | 0.5 wt % | 14.5 wt % |

Experimental Example 1: Measurement of Selection Ratio

A substrate in which a silicon oxide film (SiOx) deposited at a thickness of 500 Å and a silicon nitride film (SiN) deposited at a thickness of 5000 Å were formed on a patterned silicon semiconductor wafer.

The compositions for etching of Comparative Example 1, Reference Example 1 and Examples 1 to 5 were added to a round bottom flask and heated for 60 minutes to temperatures as shown in Table 2, followed by dipping the substrate for etching thereof.

The etching of the silicon semiconductor wafer was performed on the etching compositions for 720 seconds and 6000 seconds.

A surface of the patterned silicon wafer was selectively etched to measure thicknesses of a thin film of the silicon oxide film and the nitride film before and after the etching using ellipsometry, a thin film thickness-measuring apparatus (NANO VIEW, SEMG-1000). A result thereof is shown in Table 2.

A selection ratio represents a ratio of a nitride film etching rate (SiN E/R) to an oxide film etching rate (SiO E/R), and is calculated by dividing a difference between an initial thickness and a thickness after the etching by etching time (min).

TABLE 2

| | Process Temperature (° C.) | SiN E/R (Å/min) | SiO E/R (Å/min) | Selection ratio |
|---|---|---|---|---|
| Comp. Ex. 1 | 158 | 68.3 | 0.32 | 213 |
| Ref. Ex. 1 | 158 | 66.5 | 0.54 | 123 |
| Example 1 | 158 | 80.5 | 0.15 | 537 |
| Example 2 | 158 | 89.2 | 0.08 | 1115 |
| Example 3 | 158 | 85.8 | 0.13 | 660 |
| Example 4 | 158 | 88.1 | 0.11 | 800 |
| Example 5 | 158 | 88.3 | 0.09 | 981 |

As shown in Table 2, the etching compositions, such as Examples 1 to 5, to which etching Additives 1 to 5 in which silyl phosphate obtained through a reaction of phosphoric anhydride and the silane compound is added as an additive, showed a significantly higher etching selection ratio compared to Comparative Example 1 and Reference Example 1. Based thereon, it can be seen that the compositions for etching of the Examples are excellent as a composition for etching of the silicon nitride film. Further, in terms of the etching rate (SiN E/R), the etching compositions of the Examples showed a better effect compared to that of Comparative Example 1, thereby indicating that a composition for etching optimized for the etching process of the silicon nitride film can be provided.

3-Aminopropylsilanetriol, the additive used in Comparative Example 1, structurally includes single silicon atom. In contrast, the silane compounds used in Reference Example 1 and Examples 1 to 5 structurally include 2 silicon atoms. The silane compounds passivate a surface of a silicon oxide in accordance with an increasing number of hydroxides during the etching process, thereby reducing an etching rate of the oxide film and yielding a significantly increased selection ratio for the nitride film.

When using such silane compounds, undissolving and precipitating of the silane-based additives due to hydrolysis and polycondensation thereof, caused by water, the solvent, by including silyl phosphate obtained through a reaction of phosphoric anhydride and the silane compounds as an additive.

Accordingly, it is confirmed that use of the silyl phosphate provided in the present disclosure as an additive can improve an etching rate, an etching selection ratio and etching stability of a silicon nitride film, thereby improving etching process efficiency.

The etching composition according to the present disclosure contains a silane-base additive, which reacts with a surface of an oxide film to form a protective film protecting the oxide film, and thus has a high etching selection ratio of a nitride film to the oxide film.

The etching composition of the present disclosure can prevent undissolving and precipitating of the silane-based additives due to hydrolysis and polycondensation thereof, which is caused by the solvent using phosphoric anhydride.

Further, etching process efficiency can be improved by increasing an etching rate, an etching selection ratio and etching stability of a silicon nitride film.

Use of the etching composition of the present disclosure prevents deterioration of electrical characteristics caused by damage to a film of the oxide film or etching of the oxide film when removing the nitride film and generation of particles, thereby improving device characteristics. In particular, the present disclosure employs a silane compound containing two or more silanes, which allows to obtain an excellent selection ratio even with a small amount of the silane compound.

While exemplary embodiments have been shown and described above, it will be apparent to those skilled in the art that modifications and variations could be made without departing from the scope of the present invention as defined by the appended claims.

What is claimed is:

1. An etching composition additive comprising phosphoric acid and a silane compound represented by Formula 1 below:

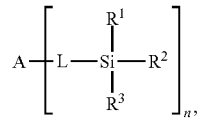

[Formula 1]

wherein, in Formula 1,
A is an n-valent radical;
L is a direct bond or $C_1$-$C_3$ hydrocarbylene;
$R^1$ to $R^3$ are independently hydrogen, hydroxy, $C_1$-$C_{20}$ hydrocarbyl or $C_1$-$C_{20}$ alkoxy; and
n is an integer of 2 to 5, and
wherein the silane compound of Formula 1 excludes siloxane.

2. The etching composition additive of claim 1, wherein the $R^1$ to $R^3$ are independently $C_1$-$C_{20}$ alkoxy.

3. The etching composition additive claim 1, wherein the A is $C_1$-$C_{20}$ hydrocarbylene, an amine salt radical, a radical having N as a binding site, a radical having O as a binding site, a radical having S as a binding site or a radical having P as a binding site.

4. The etching composition additive of claim 1, wherein the A is *—$N^+(R^{11}R^{12})X_1^-$—*,

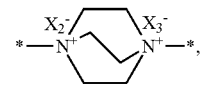

*—$NR^{13}$—*, —$NR^{14}L_1R^{15}$—*, *—$NR^{16}CONR^{17}$—*, *—$NR^{18}CSNR^{19}$—*, —$NR^{20}CONR^{21}L_2NR^{22}CONR^{23}$—*, *—$NR^{24}CONL_3L_4NCONR^{25}$—*,

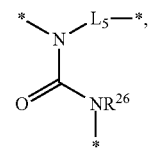

*—O—*, *—S—*, *—S—S—*,

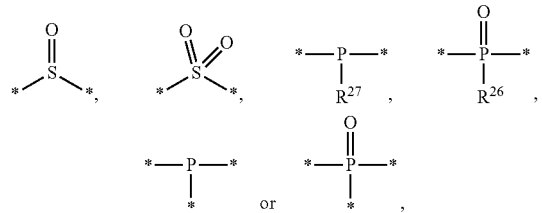

wherein

X$_1$ to X$_3$ are independently halogen or a C$_1$-C$_{20}$ alkyl carbonate group, R$^{11}$ to R$^{26}$ are independently hydrogen, C$_1$-C$_{20}$ alkyl or C$_6$-C$_{20}$ aryl, R$^{27}$ and R$^{28}$ are independently hydrogen, C$_1$-C$_{20}$ alkyl, C$_6$-C$_{20}$ aryl, C$_1$-C$_{20}$ alkoxy or (C$_1$-C$_{20}$)alkyl(C$_1$-C$_{20}$) alkoxy, L$_1$ to L$_4$ are C$_1$-C$_{20}$ alkylene, C$_6$-C$_{20}$ arylene or R$^{31}$(OR$^{32}$)$_p$, where R$^{31}$ and R$^{32}$ are independently C$_1$-C$_{20}$ alkylene, and p is an integer of 1 to 5, and L$_5$ is a direct bond or (CH$_2$)$_q$NR$^{33}$NR$^{34}$, where R$^{33}$ and R$^{34}$ are independently hydrogen, C$_1$-C$_{20}$ alkyl or C$_6$-C$_{20}$ aryl, and q is an integer of 1 to 5.

5. The etching composition of claim 1, wherein n is 2 or 3.

6. The etching composition of claim 1, wherein the silane compound is at least one selected from following Structural Formulae 1 to 26:

(1)
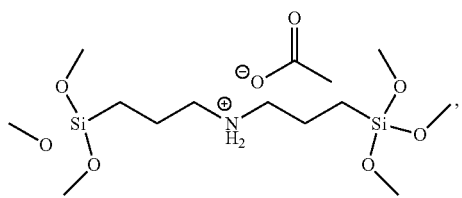

(2)
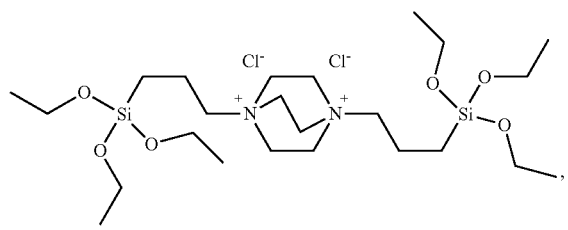

(3)
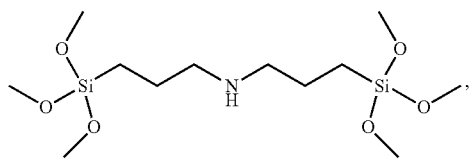

(4)
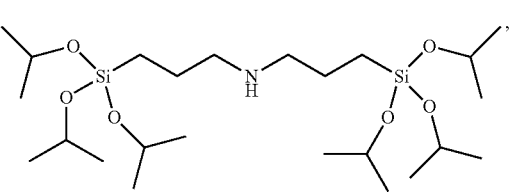

(5)
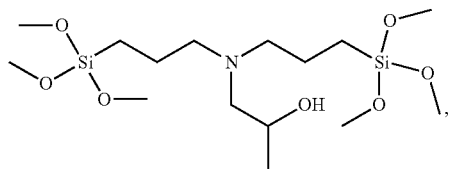

(6)
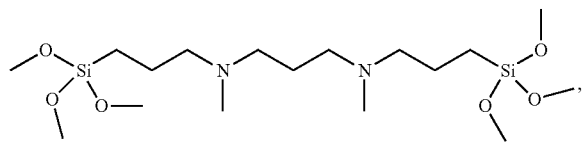

(7)
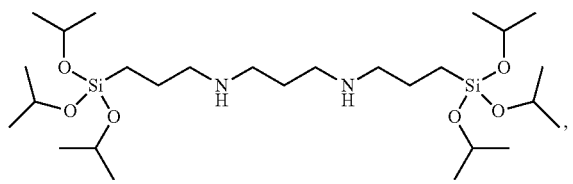

(8)
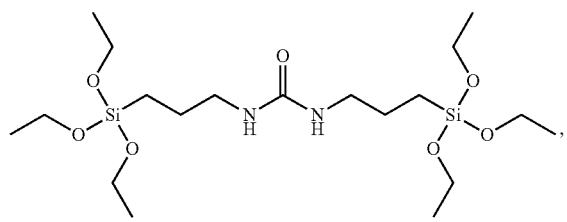

(9)
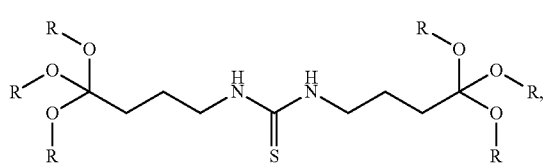

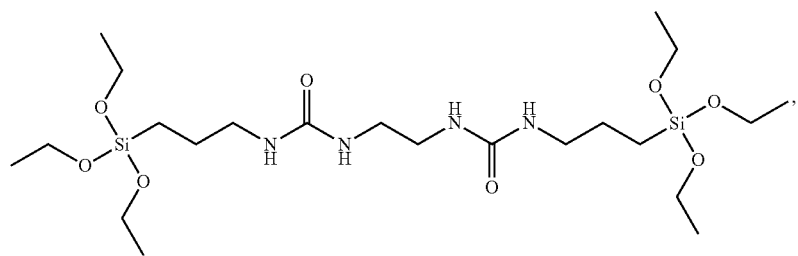
(10)
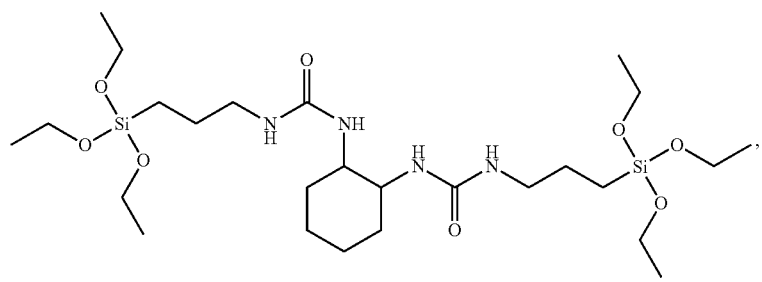
(11)
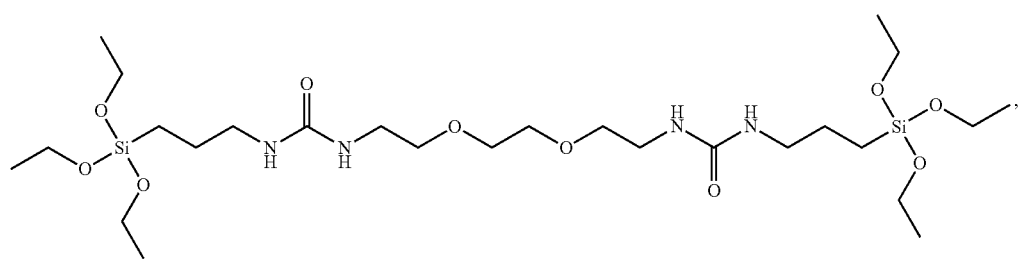
(12)
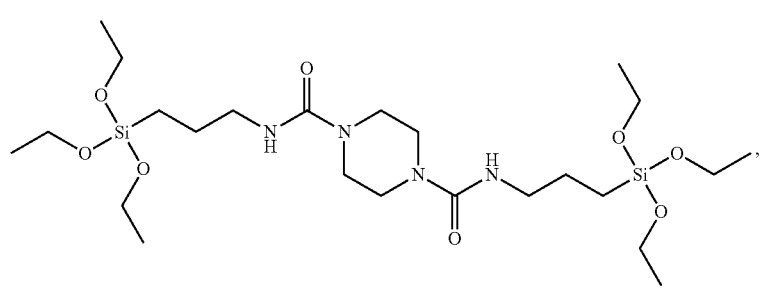
(13)
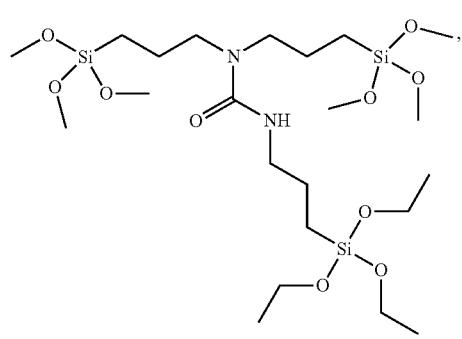
(14)

(15) 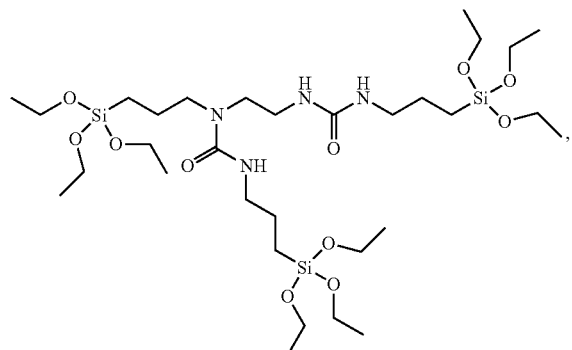

(16) 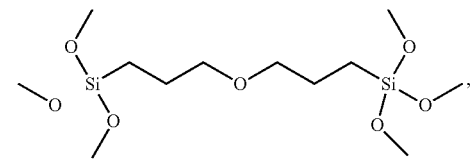

(17) 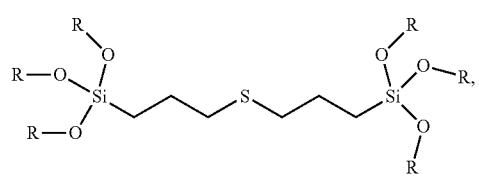

(18) 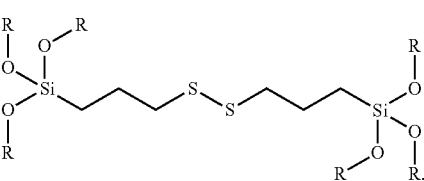

(19) 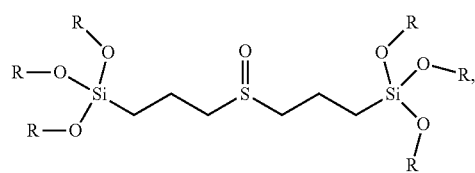

(20) 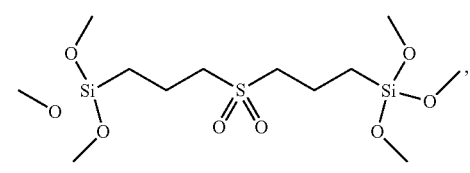

(21) 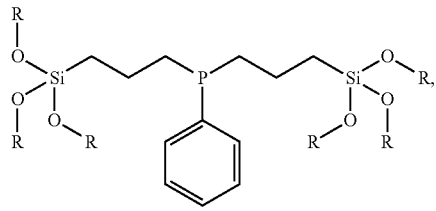

(22) 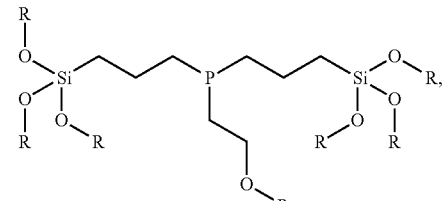

(23) 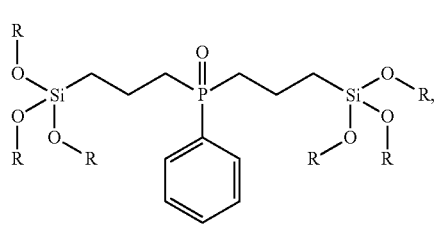

(24) 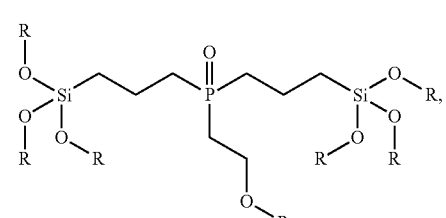

(25) 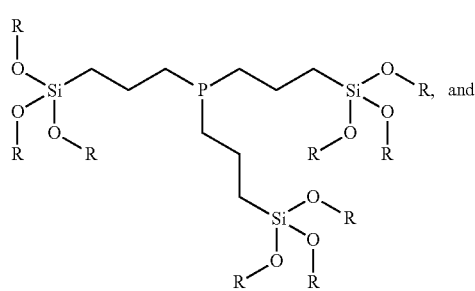

(26) 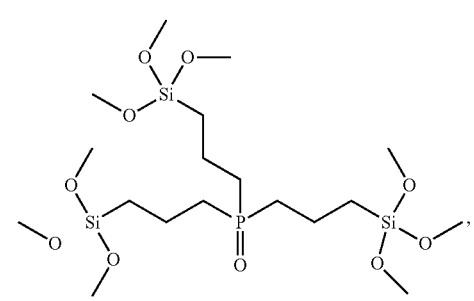

wherein, in the above formulae, R is hydrogen, $C_1$-$C_{20}$ alkyl or $C_6$-$C_{20}$ aryl.

7. The etching composition additive of claim 1, wherein the phosphoric anhydride is at least one selected from the group consisting of water-removed pure phosphoric acid, pyrophosphoric acid, polyphosphoric acid having at least 3 Ps and metaphosphoric acid.

8. The etching composition additive of claim 1, wherein the etching composition additive is produced through a

US 10,941,341 B2

39 reaction of 0.1 part by weight to 10 parts by weight of the silane compound based on 100 parts by weight of the phosphoric anhydride.

9. A method for preparing an etching composition additive, comprising:
   preparing a mixture comprising phosphoric anhydride and a silane compound of Formula 1; and
   reacting the mixture to prepare a silyl phosphate compound:

[Formula 1]

$$A{-}\!\!\left[\!L{-}\underset{R^3}{\overset{R^1}{\underset{|}{\overset{|}{Si}}}}{-}R^2\right]_{\!n},$$

wherein, in Formula 1,
A is an n-valent radical;
L is a direct bond or $C_1$-$C_3$ hydrocarbylene;
$R^1$ to $R^3$ are independently hydrogen, hydroxy, $C_1$-$C_{20}$ hydrocarbyl or $C_1$-$C_{20}$ alkoxy; and
n is an integer of 2 to 5, and
wherein the silane compound of Formula 1 excludes siloxane.

10. The method of claim 9, wherein the $R^1$ to $R^3$ are independently $C_1$-$C_{20}$ alkoxy.

11. The method of claim 9, wherein the A is $C_1$-$C_{20}$ hydrocarbylene, an amine salt radical, a radical having N as a binding site, a radical having O as a binding site, a radical having S as a binding site or a radical having P as a binding site.

12. The method of claim 11, wherein the A is *—N$^+$($R^{11}R^{12}$)$X_1^-$—*,

40

*—NR$^{13}$—*, *—NR$^{14}L_1$R$^{15}$—*, *—NR$^{16}$CONR$^{17}$—*,
*—NR$^{18}$CSNR$^{19}$—*, —NR$^{20}$CONR$^{21}$L$_2$NR$^{22}$CONR$^{23}$—*, *—NR$^{24}$CONL$_3$L$_4$NCONR$^{25}$—*,

*—O—*, *—S—*, *—S—S—*, wherein
$X_1$ to $X_3$ are independently halogen or a $C_1$-$C_{20}$ alkyl carbonate group,
$R^{11}$ to $R^{26}$ are independently hydrogen, $C_1$-$C_{20}$ alkyl or $C_6$-$C_{20}$ aryl,
$R^{27}$ and $R^{28}$ are independently hydrogen, $C_1$-$C_{20}$ alkyl, $C_6$-$C_{20}$ aryl, $C_1$-$C_{20}$ alkoxy or ($C_1$-$C_{20}$)alkyl($C_1$-$C_{20}$)alkoxy,
$L_1$ to $L_4$ are $C_1$-$C_{20}$ alkylene, $C_6$-$C_{20}$ arylene or $R^{31}$(OR$^{32}$)$_p$,
where $R^{31}$ and $R^{32}$ are independently $C_1$-$C_{20}$ alkylene, and p is an integer of 1 to 5, and
$L_5$ is a direct bond or (CH$_2$)$_q$NR$^{33}$NR$^{34}$,
where $R^{33}$ and $R^{34}$ are independently hydrogen, $C_1$-$C_{20}$ alkyl or $C_6$-$C_{20}$ aryl, and q is an integer of 1 to 5.

13. The method of claim 9, wherein n is 2 or 3.

14. The method of claim 9, wherein the silane compound is at least one selected from following Structural Formulae 1 to 26:

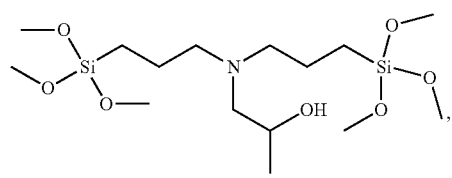
(5)
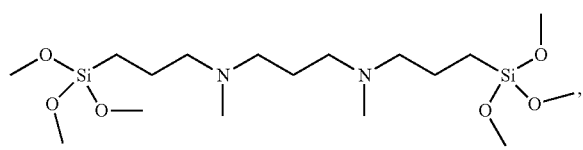
(6)
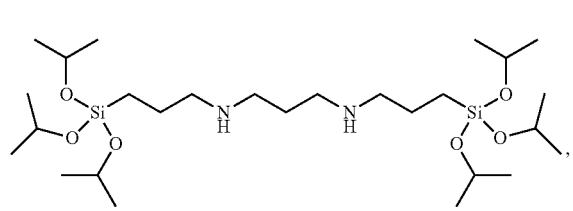
(7)
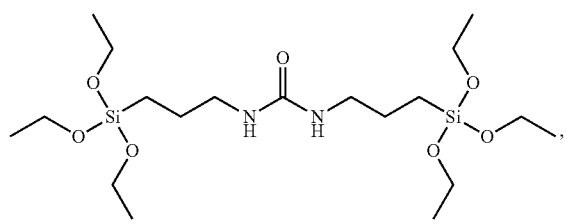
(8)
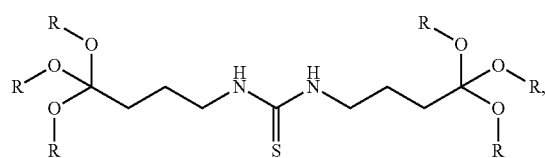
(9)
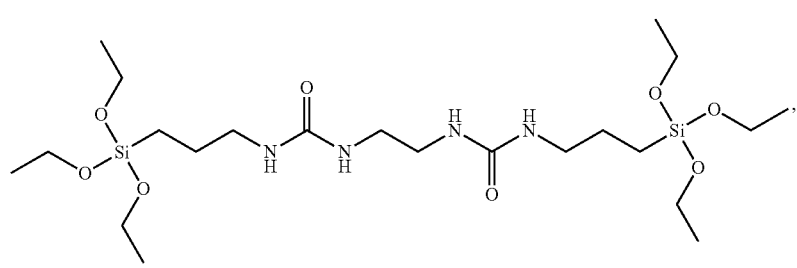
(10)
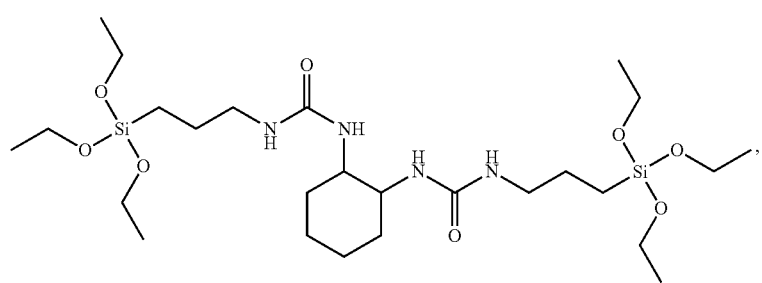
(11)
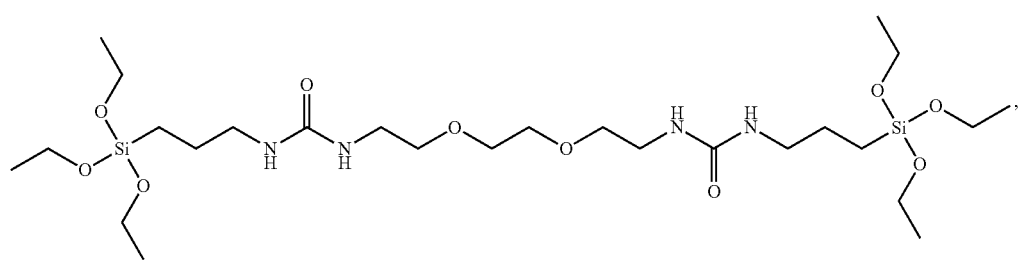
(12)

(13)
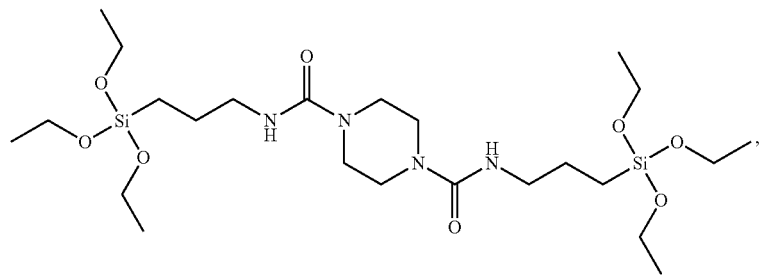
(14)
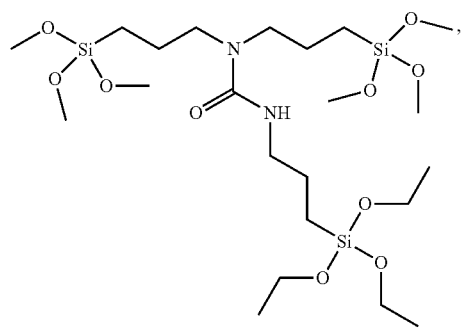
(15)
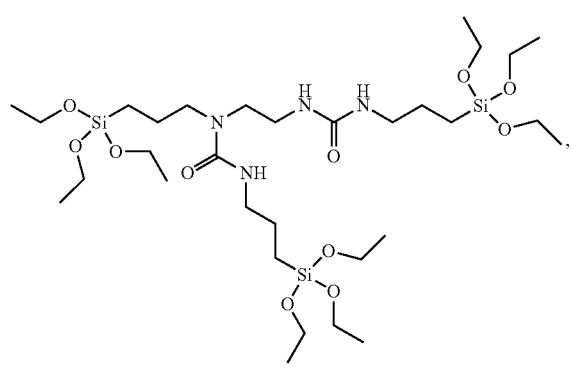
(16)
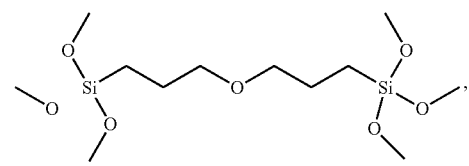
(17)
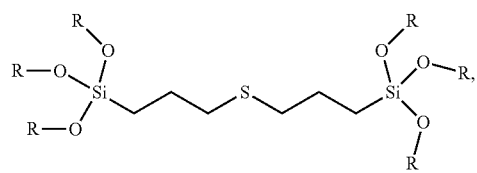
(18)
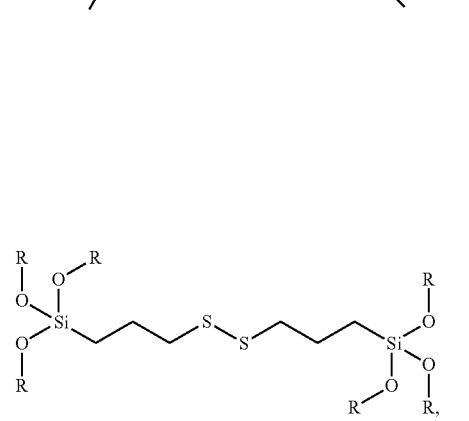
(19)
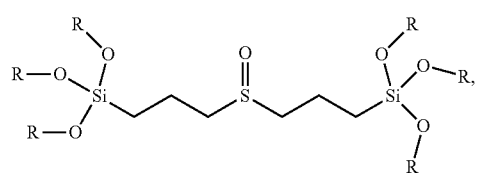
(20)
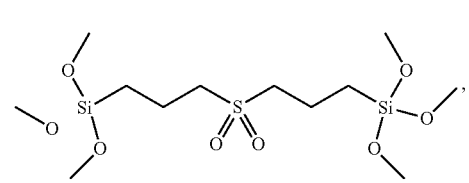
(21)
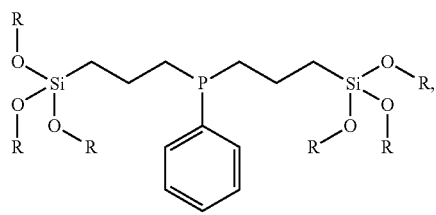
(22)
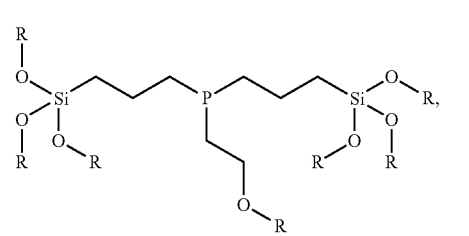

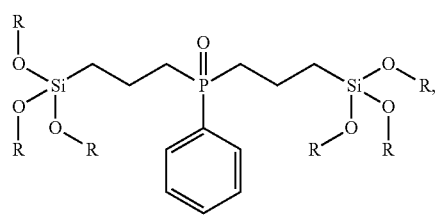
(23)

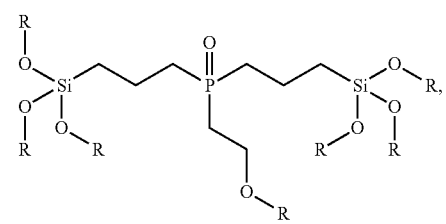
(24)

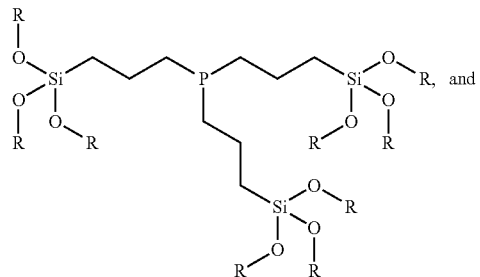
(25)

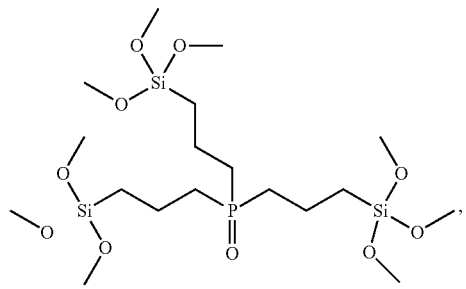
(26)

wherein, in the above formulae, R is hydrogen, $C_1$-$C_{20}$ alkyl or $C_6$-$C_{20}$ aryl.

15. The method of claim 9, wherein the phosphoric anhydride is at least one selected from the group consisting of water-removed pure phosphoric acid, pyrophosphoric acid, polyphosphoric acid having at least 3 Ps and metaphosphoric acid.

16. The method of claim 9, wherein the etching composition additive comprises 100 parts by weight of the phosphoric anhydride and 0.1 part by weight to 10 parts by weight of the silane compound based on 100 parts by weight of the phosphoric anhydride.

17. An etching composition, comprising
a phosphoric acid;
the etching composition additive of claim 1; and
a solvent.

18. The etching composition of claim 17, wherein the etching composition additive comprises a silyl phosphate in an amount of 0.01 wt % to 10 wt %.

19. The etching composition of claim 17, wherein the etching composition comprises 70 wl % to 89 wt % phosphoric acid, 0.01 wt % to 10 wt % etching composition additive and 11 wt % to 30 wt % solvent.

20. The etching composition of claim 17, further comprising a silane compound represented by Formula 2 below:

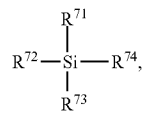

[Formula 2]

wherein, in Formula 2, $R^{71}$ to $R^{74}$ are independently hydrogen, hydrocarbyl or heterohydrocarbyl, and $R^{71}$ to $R^{74}$ may individually exist or two or more thereof form a ring, connected by a heteroelement.

* * * * *